United States Patent [19]

Mori

[11] Patent Number: 5,646,888
[45] Date of Patent: Jul. 8, 1997

[54] SEMICONDUCTOR DEVICE HAVING ISOLATING REGIONS

[75] Inventor: Seiichi Mori, Tokyo, Japan

[73] Assignee: Kabushiki Kaisha Toshiba, Kawasaki, Japan

[21] Appl. No.: 202,174

[22] Filed: Feb. 25, 1994

[30] Foreign Application Priority Data

Feb. 26, 1993 [JP] Japan ................................. 5-037757

[51] Int. Cl.$^6$ ................................................ G11C 11/34
[52] U.S. Cl. ...................... 365/185.33; 257/315; 257/397; 257/398; 257/399
[58] Field of Search .......................... 365/185, 185.33; 257/315, 397, 398, 399

[56] References Cited

U.S. PATENT DOCUMENTS

| | | | |
|---|---|---|---|
| 4,698,900 | 10/1987 | Esquivel | 437/52 |
| 4,833,514 | 5/1989 | Esquivel et al. | 437/52 |
| 5,278,438 | 1/1994 | Kim et al. | 257/397 |
| 5,321,288 | 6/1994 | Gill et al. | 365/188.33 |

OTHER PUBLICATIONS

*IEDM Technical Digest*, p. 583, Dec. 1989, Yosiaki S. Hisamune, et al., "A 3.6 μm$^2$ Memory Cell Structure for 16MB EPROMS".

Primary Examiner—David C. Nelms
Assistant Examiner—F. Niranjan
Attorney, Agent, or Firm—Banner & Witcoff, Ltd.

[57] ABSTRACT

Disclosed is a semiconductor memory device which has memory cell transistors each comprising a liner source diffusion layer, a land-shaped drain diffusion layer, a gate oxide film containing a floating gate formed on the channel region between those diffusion layers, and a control gate formed on the gate oxide film. Trenches are formed in the substrate in no contact with the channel regions to isolate the cell transistors from each other.

53 Claims, 27 Drawing Sheets

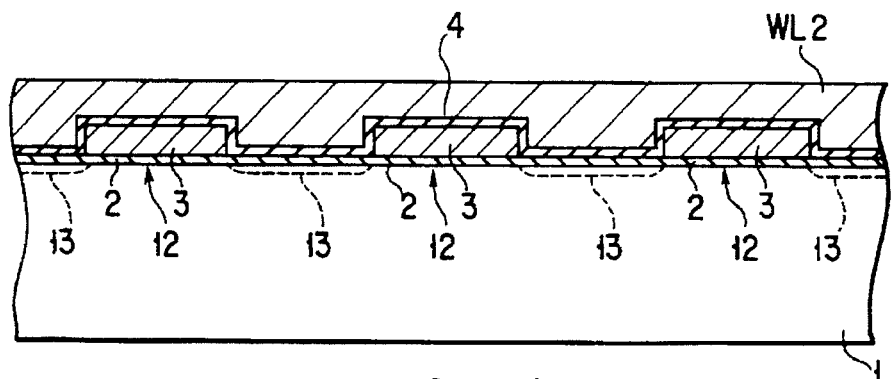
F I G. 4A
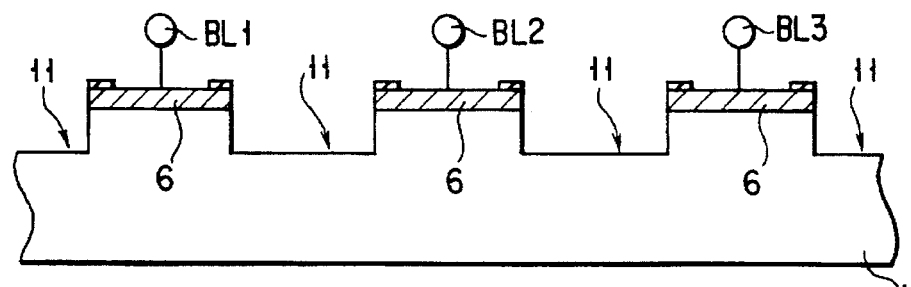
F I G. 4B
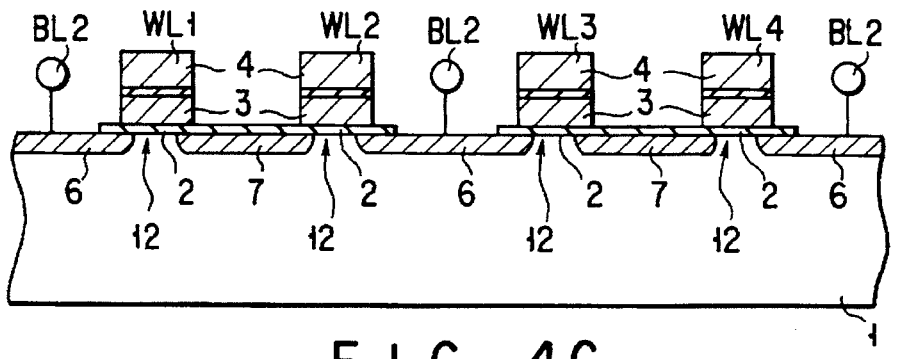
F I G. 4C
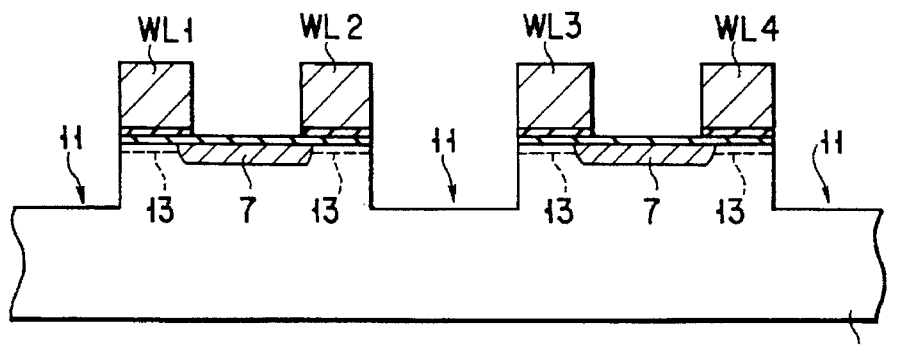
F I G. 4D

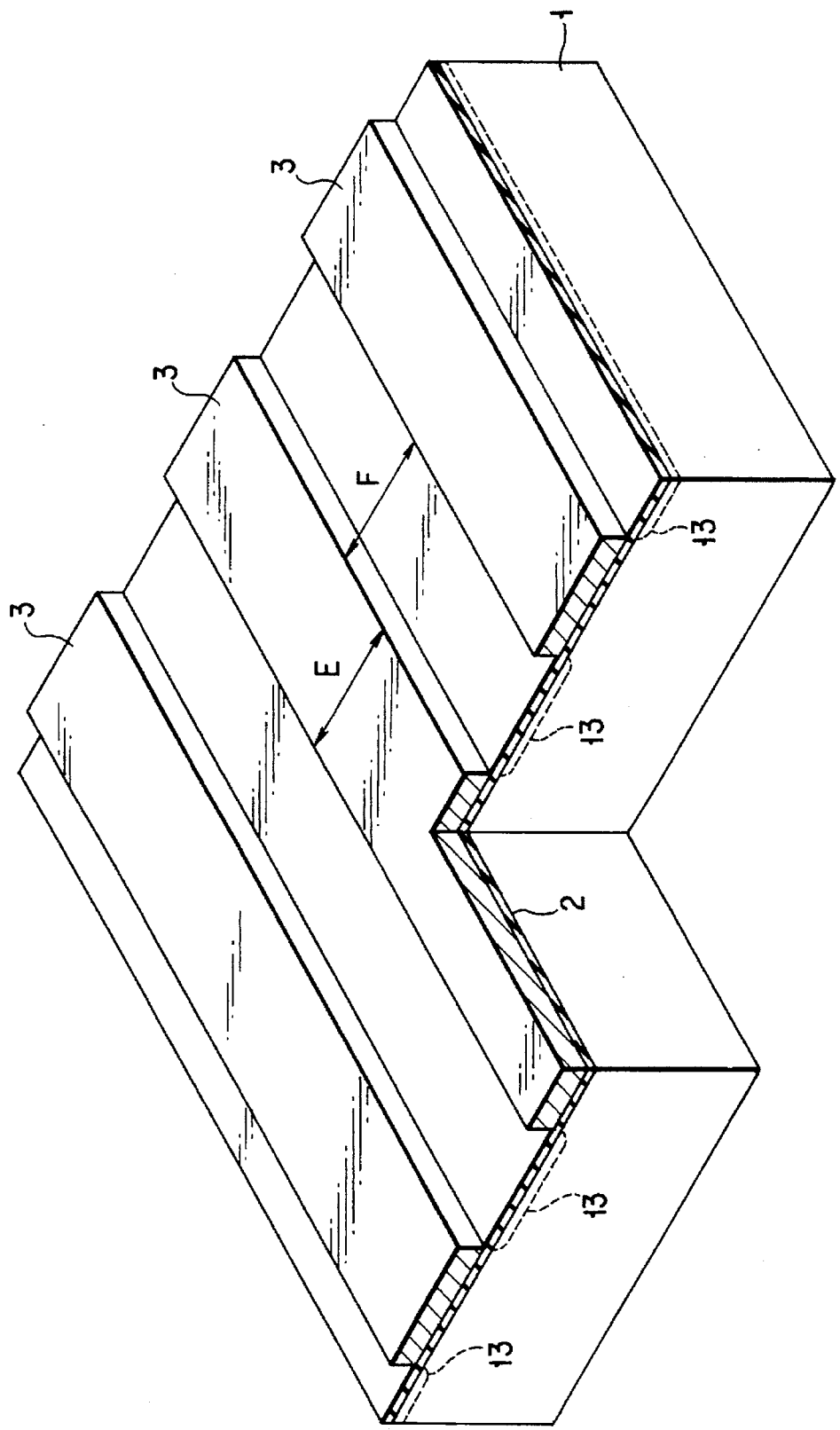

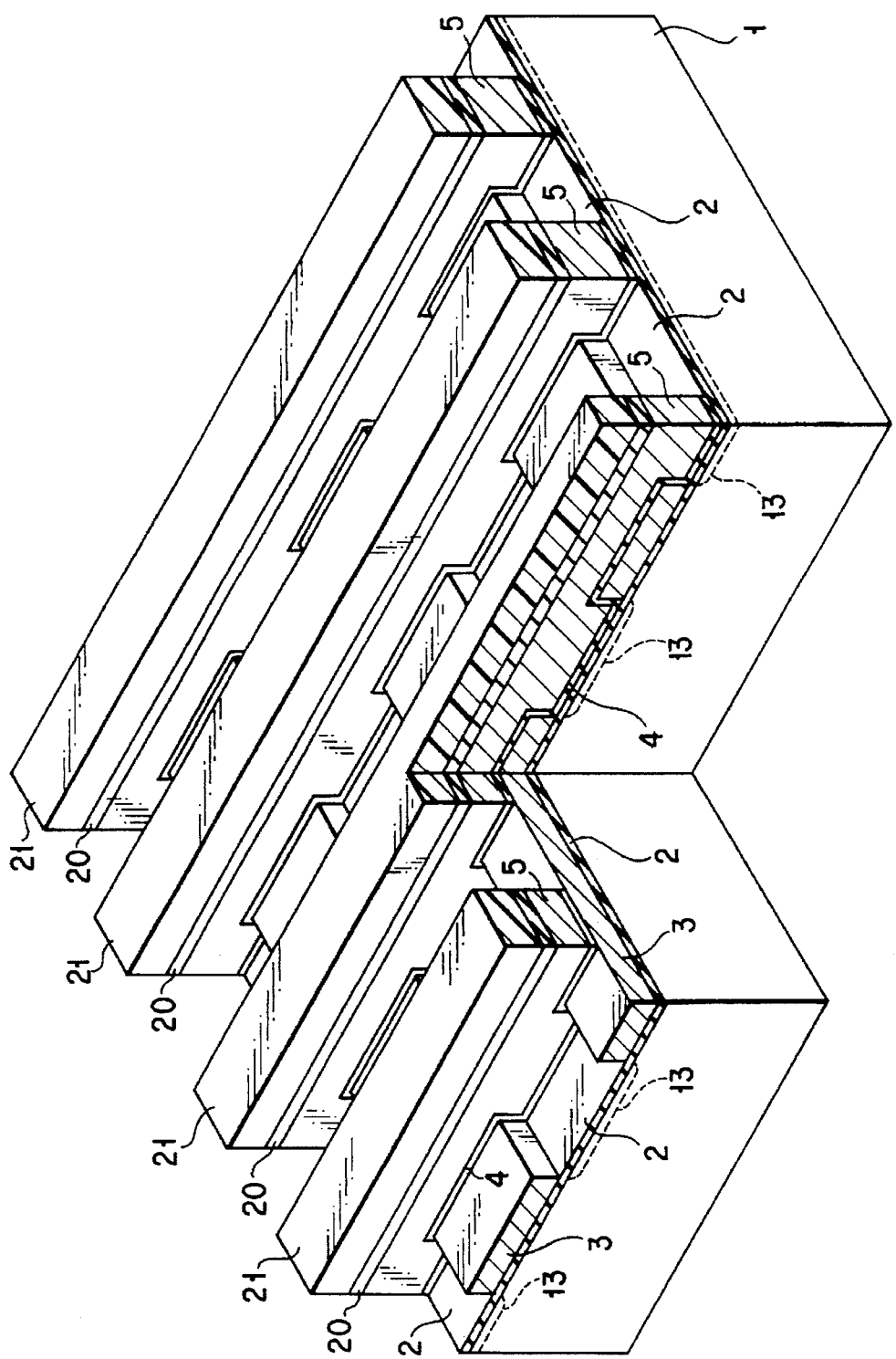
F I G. 6C

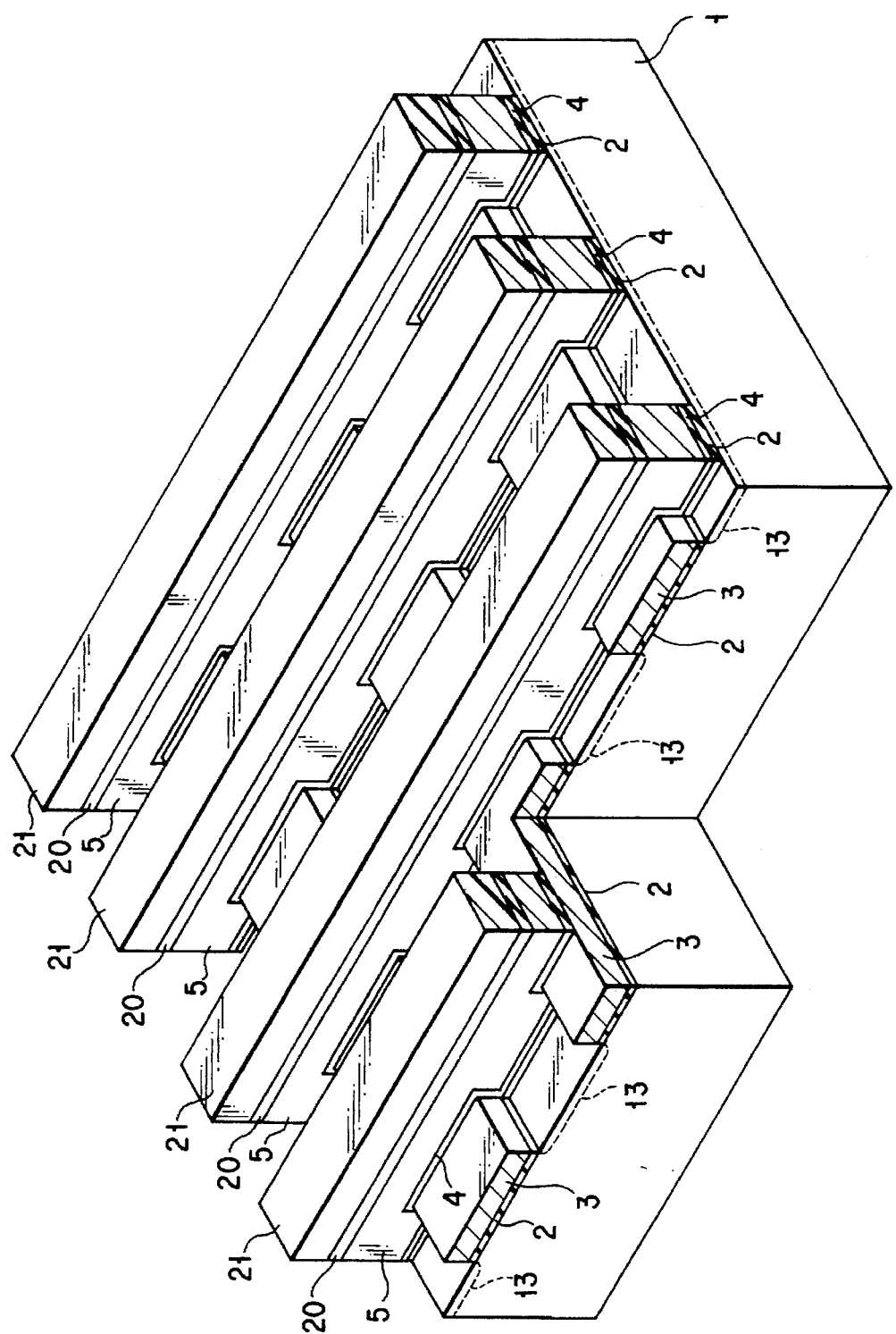
F I G. 7A

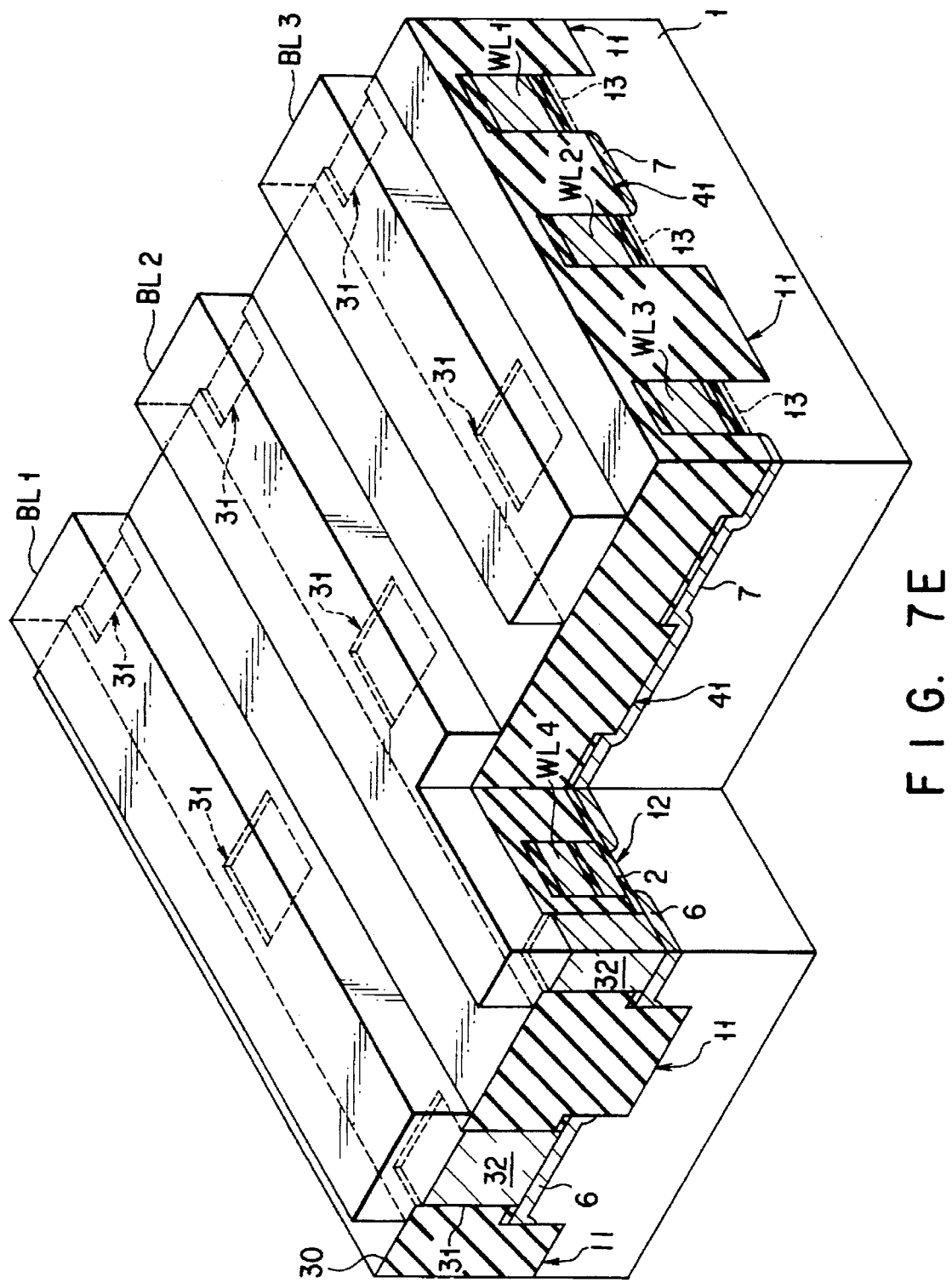
F I G. 7E

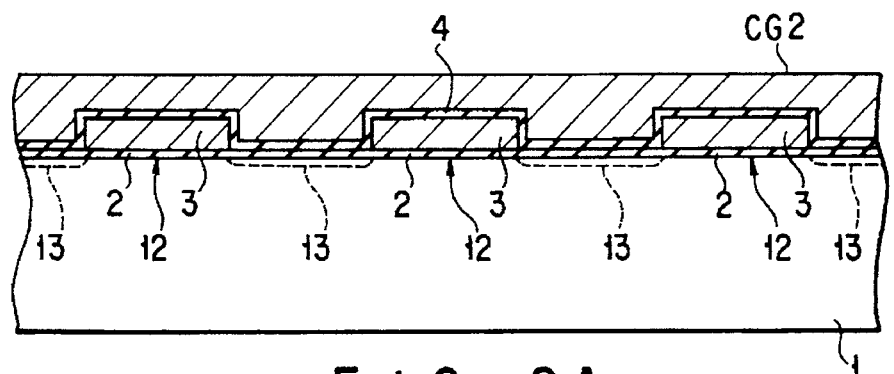
F I G. 9A
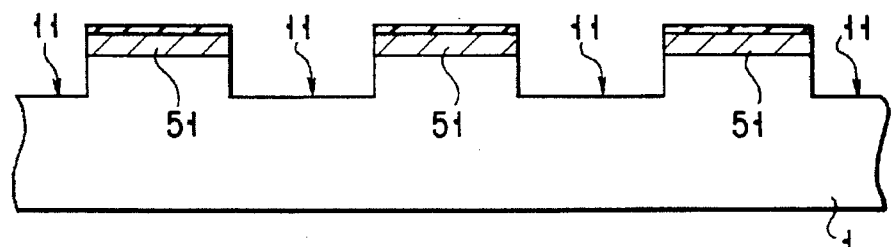
F I G. 9B
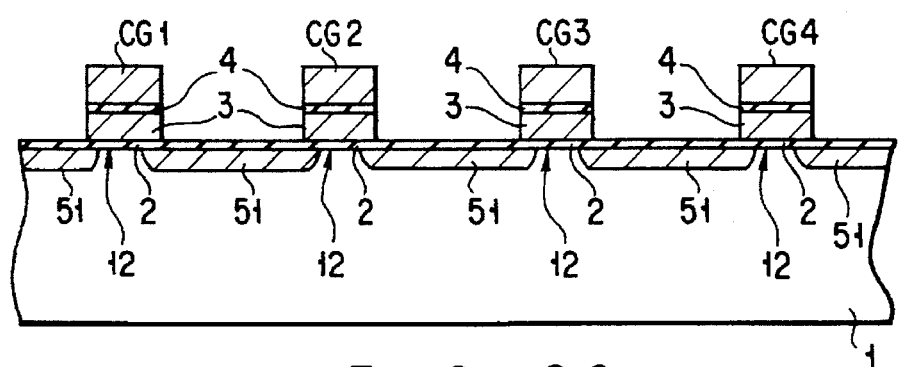
F I G. 9C
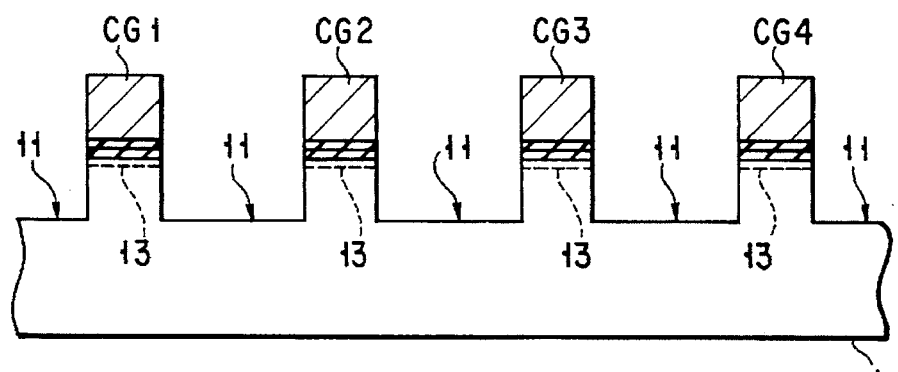
F I G. 9D

SEMICONDUCTOR DEVICE HAVING ISOLATING REGIONS

BACKGROUND OF THE INVENTION

1. Field of the Invention

The present invention relates to a semiconductor memory device, and, more particularly, to the improvement on the method of isolating memory cell transistors used in a non-volatile semiconductor memory device, such as EPROM or EEPROM or flash EEPROM.

2. Description of the Related Art

FIG. 1 is a plan view of the typical pattern of the memory cell matrix of an EPROM, FIG. 2A is a cross-sectional view taken along line 2A—2A in FIG. 1, and FIG. 2B is a cross-sectional view taken along line 2B—2B in FIG. 1.

As shown in FIGS. 1 through 2B, a plurality of memory cell transistors are formed in a matrix form in a P-type silicon substrate 1. The broken-line block A in FIG. 1 indicates the area of a single memory cell transistor. Each memory cell transistor comprises a first gate oxide film 2 formed on the substrate 1, a floating gate 3 formed on this first gate oxide film 2, a control gate 5 formed on the floating gate 3 via a second gate insulating film 4 (which is generally called "interpoly insulating film"), an N-type drain diffusion layer 6 and an N-type source diffusion layer 7. The drain diffusion layer 6 is shared by the adjoining memory cell transistors in the same column, while the source diffusion layer 7 is shared by the memory cell transistors in the associated row and those in one adjoining row. Any adjoining memory cell transistors in the same row are isolated by an LOCOS oxide film 8 formed on the substrate 1 by local oxidation. The portion denoted by reference numeral "9" is a contact region for the drain diffusion layer 7 and a bit line BL.

Due to today's demand for a large capacity of a semiconductor memory device, it is desirable that the integration of memory cell transistors be improved. As one way of achieving higher integration, the LOCOS oxide film 8, i.e., the area of the device isolation region, is reduced.

It is however known that bird's beaks are apt to be produced in the LOCOS oxide film, making it difficult to efficiently reduce the area of this oxide film. In particularly, it is difficult to reduce the isolation width X between devices. The bird's beak may adversely affect the reliability of the gate oxide film or the like of the memory cell transistor.

To overcome the problem that the isolation width cannot be made narrower, there has been an attempt to form a groove or trench in the silicon substrate to isolate devices, as disclosed in IEDM Technical Digest, 1989, p. 583 to p. 586, by Yoshiaki Hisamune et al.

The structure of this known trench isolation type memory cell transistor will achieve the purpose of making the isolation width of the device narrower than the structure of isolating devices by the LOCOS oxide film.

As the trench isolation is provided along the channel region of the memory cell transistors, however, a leak current is undesirably produced along the side surface of the trench from the channel region. Further, since stress is applied directly to the channel region in the etching step for providing the trench isolation and the step of burying the insulating film in the trench, the adverse influence on the reliability of the gate oxide film or the like of a cell should also be considered. In addition to the stress, the channel region is exposed so that the channel region and the gate oxide film may be contaminated by a harmful impurity.

SUMMARY OF THE INVENTION

It is therefore an object of the present invention to provide a semiconductor memory device which will improve the degree of the integration of memory cell transistors without impairing the reliability of the memory cell transistors.

A semiconductor memory device embodying this invention has a plurality of memory cell transistors arranged in a matrix form in a semiconductor substrate of a first conductivity type and each constituted of an insulating gate field effect transistor (FET) having a charge accumulation layer for variably adjusting a threshold value, formed between a gate electrode and a channel region, and a trench formed in that portion of the substrate which lies between semiconductor layers of a second conductivity type serving as drains of those memory cell transistors adjoining in a row direction, and not substantially formed in that portion of the substrate which lies between the channel regions of those memory cell transistors adjoining in the row direction.

The semiconductor memory device further comprises isolation means different from the trenches, formed in that portion of the substrate which lies between the channel regions of the memory cell transistors. Each trench isolates the semiconductor layers of the memory cell transistors adjoining in the row direction from each other, and the isolation means isolates the channel regions of the memory cell transistors adjoining in the row direction from each other.

Further, the isolation means comprises a semiconductor layer of the first conductivity type having a higher concentration than the substrate.

According to the semiconductor memory device with the above structure, the trenches are not substantially formed in that portion of the substrate which lies between the channel regions of those memory cell transistors adjoining in the row direction, but are formed in that portion of the substrate which lies between semiconductor layers of the second conductivity type serving as drains of those memory cell transistors adjoining in a row direction. That is, since the trench is not formed along the channel region of each memory cell transistor, no leak current will be produced along the side surface of the trench from the channel region. Further, since no stress is applied directly to the channel region in the etching step for providing the trench isolation and the step of burying the insulating film in the trench, a stress-originated reduction in reliability of memory cell transistors hardly occurs. Further, the channel region is not exposed, thus reducing the possibility that the channel region will be contaminated by a harmful impurity.

Therefore, the semiconductor memory device embodying this invention will improve the degree of the integration of the memory cell transistors without impairing the reliability of the memory cell transistors.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4A is a cross-sectional view taken along line 4A—4A in FIG. 3;

FIG. 4B is a cross-sectional view taken along line 4B—4B in FIG. 3;

FIG. 4C is a cross-sectional view taken along line 4C—4C in FIG. 3;

FIG. 4D is a cross-sectional view taken along line 4D—4D in FIG. 3;

FIGS. 6A through 6G are perspective views of the semiconductor memory device according to the first embodiment of this invention in main steps of fabricating the same;

FIGS. 7A through 7E are perspective views of the semiconductor memory device according to the first embodiment of this invention in main steps of another fabrication method;

FIG. 9A is a cross-sectional view taken along line 9A—9A in FIG. 8;

FIG. 9B is a cross-sectional view taken along line 9B—9B in FIG. 8;

FIG. 9C is a cross-sectional view taken along line 9C—9C in FIG. 8;

FIG. 9D is a cross-sectional view taken along line 9D—9D in FIG. 8;

DETAILED DESCRIPTION OF THE PREFERRED EMBODIMENTS

Figure 1:
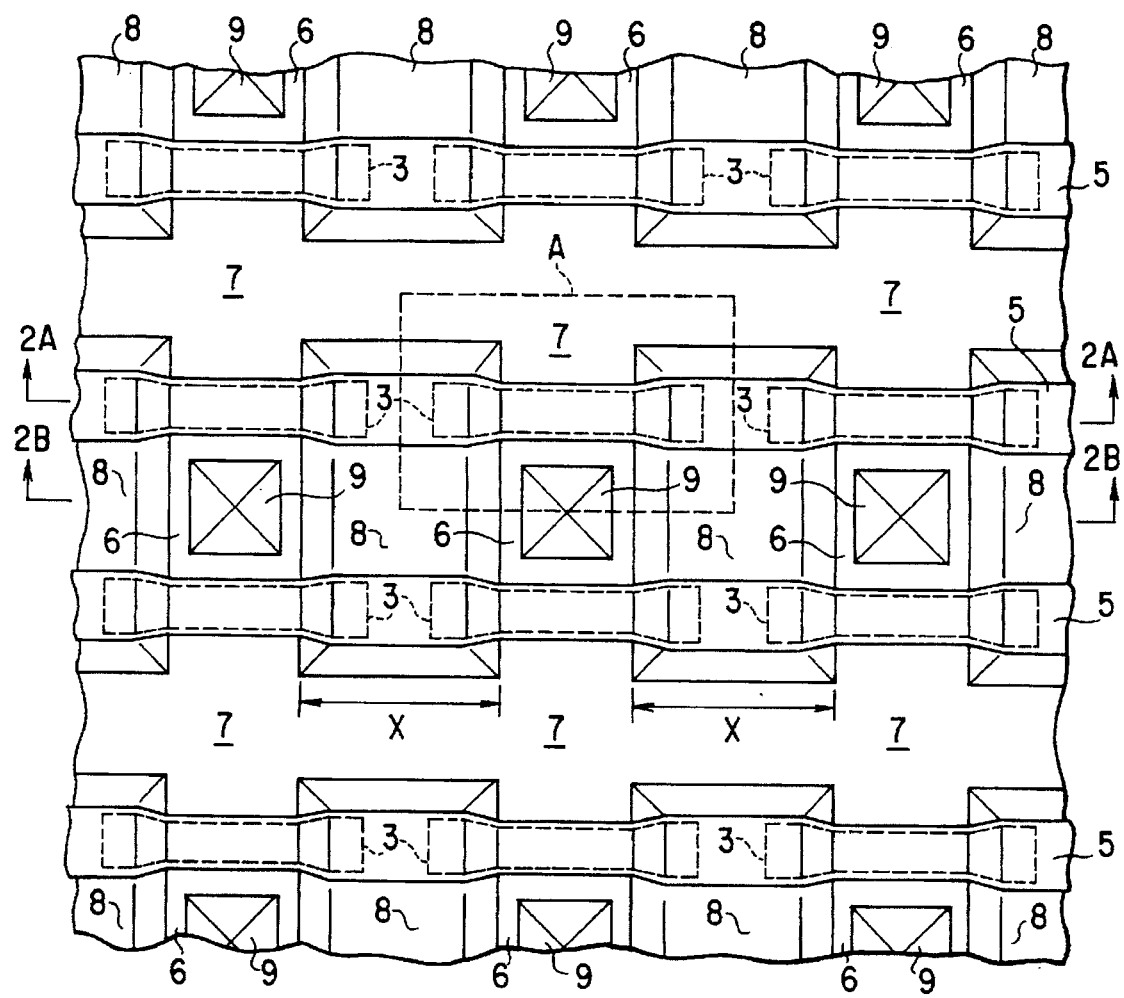
FIG. 1 is a plan view of the typical pattern of the memory cell matrix of an EPROM.

Preferred embodiments of the present invention will be described below. Like or same reference numerals will be given to corresponding or identical portions through the whole drawings to thereby avoid repeating their description.

Figure 3:
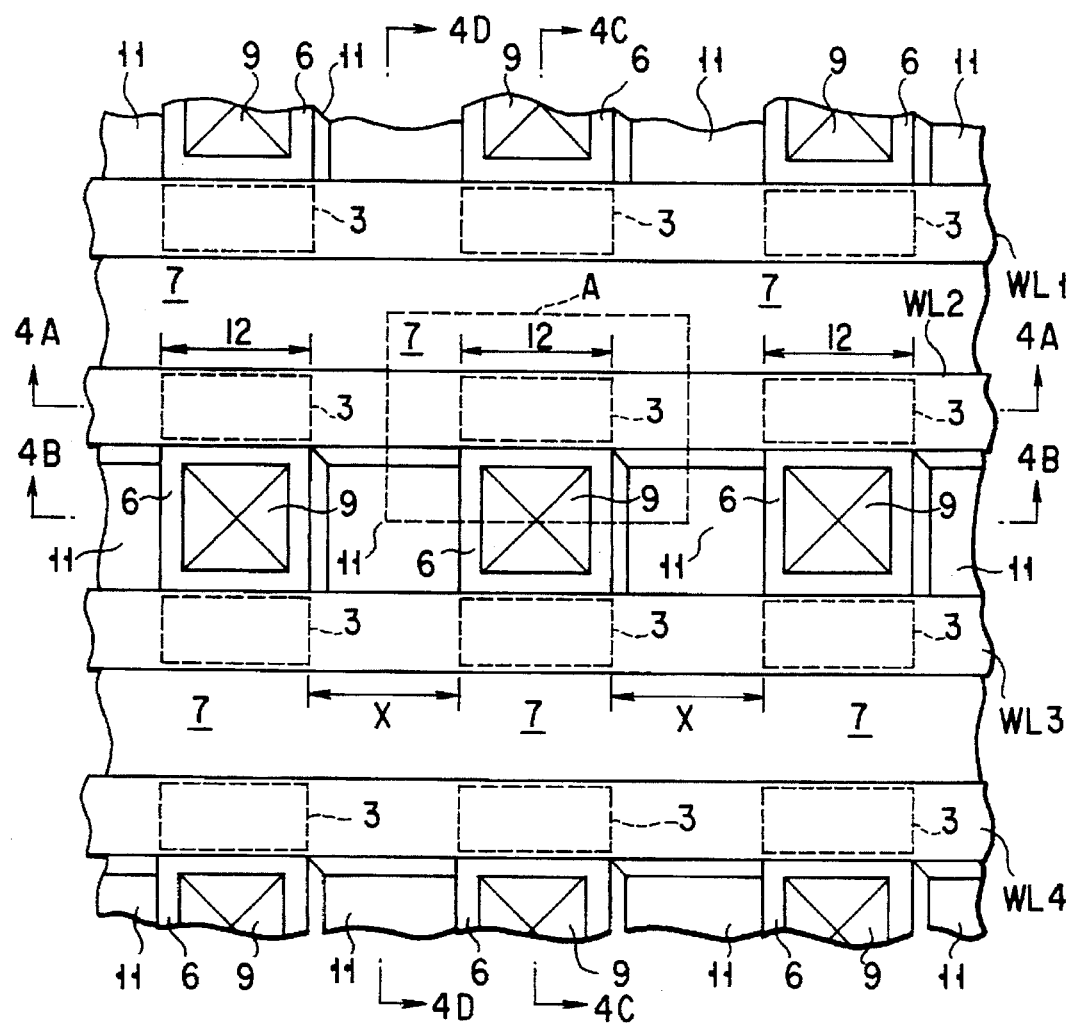
FIG. 3 is a plan view of the basic pattern of the memory cell matrix of a semiconductor memory device according to a first embodiment of the present invention.
Figure 5:
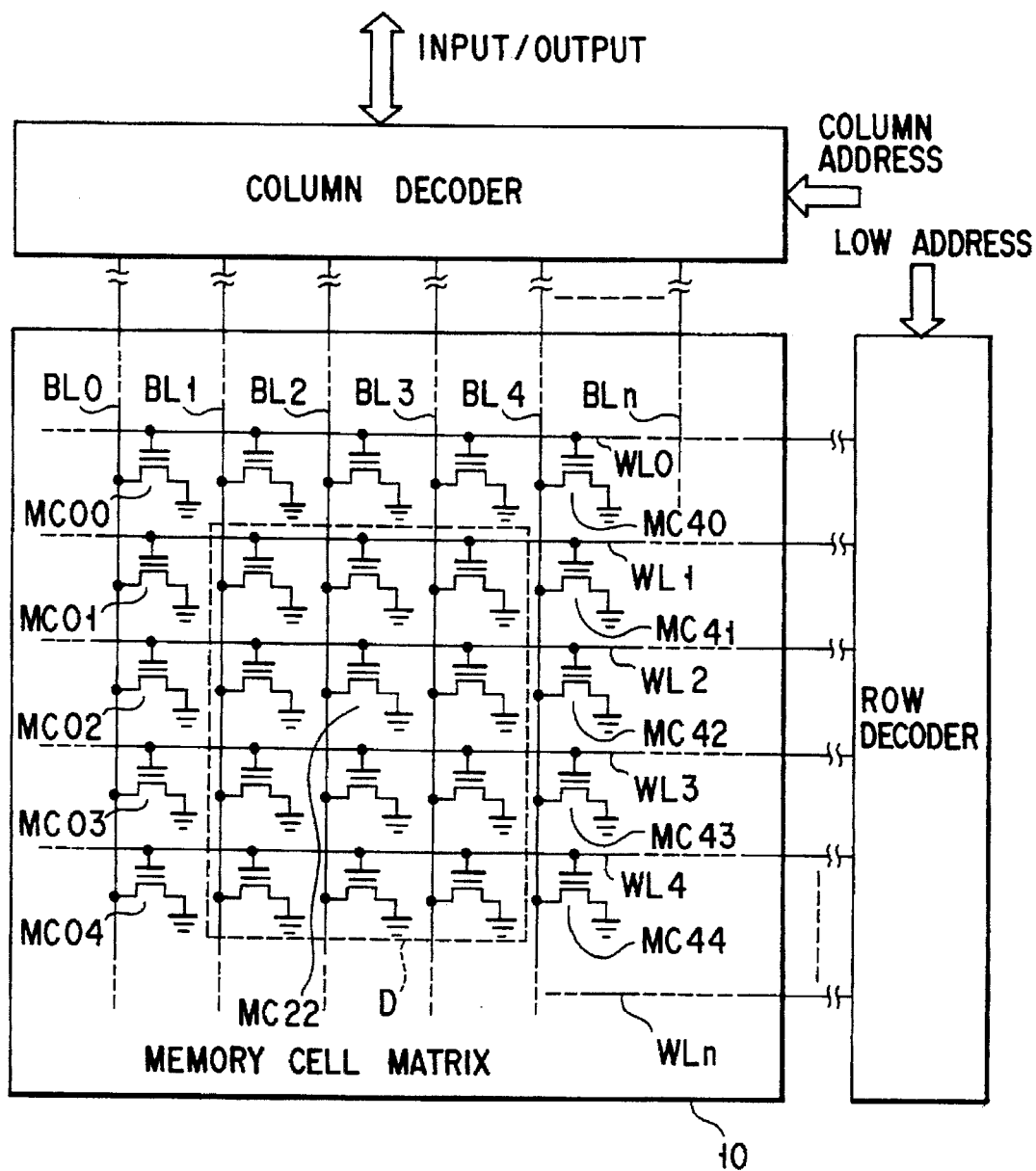
FIG. 5 is a schematic block diagram of the semiconductor memory device according to the first embodiment of this invention.

FIG. 3 is a pattern plan view showing the basic structure of the memory cell matrix of a flash EEPROM according to the first embodiment of this invention. FIG. 4A is a cross-sectional view taken along line 4A—4A in FIG. 3, FIG. 4B is a cross-sectional view taken along line 4B—4B in FIG. 3, FIG. 4C is a cross-sectional view taken along line 4C—4C in FIG. 3, and FIG. 4D is a cross-sectional view taken along line 4D—4D in FIG. 3. FIG. 5 is a schematic block diagram of the semiconductor memory device according to the first embodiment. The pattern plan view of FIG. 3 corresponds to the portion indicated by the broken-line block D in FIG. 5.

As shown in FIGS. 3 through 5, a memory cell matrix 10 is provided in a P-type silicon substrate 1, with a plurality of memory cell transistors MC00 to MC44 arranged in a matrix form in this memory cell matrix 10. Each of the memory cell transistors MC00 to MC44 is constituted of an insulating gate type FET having a floating gate electrode between the gate electrode and channel region to change a threshold value.

The broken-line block A in FIG. 3 indicates the area of a single memory cell transistor MC22. Each of the memory cell transistors MC00 to MC44 comprises a first gate oxide film 2 formed of silicon dioxide on the substrate 1, a floating gate 3 formed of polysilicon on this first gate oxide film 2, a control gate 5 (word lines WL0–WLn) formed on the floating gate 3 via a second gate insulating film 4 (which is generally called "interpoly insulating film"), an N-type drain diffusion layer 6 of a island shape, and an N-type source diffusion layer 7 of a stripe shape. The drain diffusion layer 6 is shared by the adjoining memory cell transistors MC in the same column, while the source diffusion layer 7 is shared by the memory cell transistors MC in the associated row and those in one adjoining row. A trench 11 is formed in that portion of the substrate 1 which lies between the drain diffusion layers 6 of those memory cell transistors MC adjoining in the row direction. This trench 11 will not be formed substantially in that portion of the substrate 1 which lies between channel regions 12 of those memory cell transistors MC adjoining in the row direction, as shown particularly in FIGS. 4A through 4D. A P-type diffusion layer 13 having a higher concentration than the substrate 1 is formed in that portion of the substrate 1 which lies between the channel regions 12. Each diffusion layer 13 is a region which isolates the channel regions 12 of the memory cell transistors MC adjoining in the row direction from each other or prevents the generation of a leak current flowing from the drain diffusion layer 6 to the source diffusion layer 7 without going through the channel region 12. A parasitic transistor having a word line WL as its gate is formed in that portion of the substrate 1 which lies between channel regions 12 of those memory cell transistors MC adjoining in the row direction. However, this parasitic transistor can always be set off by providing the diffusion layer 13 having a higher concentration than the substrate 1.

The drain diffusion layers 6 of those memory cell transistors MC adjoining in the row direction are isolated from each other by the trench 11. The portions denoted by reference numeral "9" are contact regions for the drain diffusion layers 7 and bit lines BL0 to BL4.

Figure 2A:
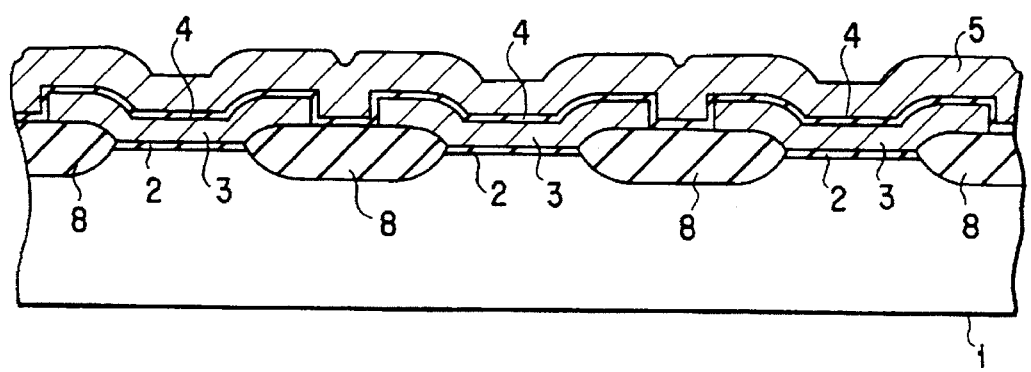
FIG. 2A is a cross-sectional view taken along line 2A—2A in FIG. 1.
Figure 2B:
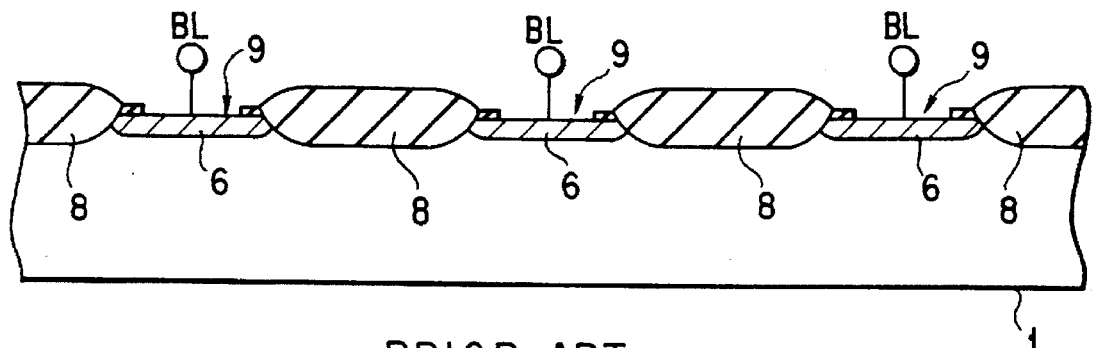
FIG. 2B is a cross-sectional view taken along line 2B—2B in FIG. 1.

According to the semiconductor memory device of the first embodiment, since the drain diffusion layers 6 of those memory cell transistors MC adjoining in the row direction are isolated from each other by the trench 11, a bird's beak will not extend as compared with the conventional device as shown in FIGS. 1 and 2. The isolation distance between the drain diffusion layers 6 can thus be reduced to the minimum lithography size.

Since the trench 11 is not formed along the channel region 12, a leak current will hardly be produced along the side surface of the trench 11 from the channel region, as compared with the conventional device disclosed in the aforementioned publication. Further, since no stress is applied directly to the channel region 12 in the etching step for forming the trench 11 and the step of burying the insulating film in the trench 11, a stress-originated reduction in reliability of memory cell transistors will hardly occur. Further, the channel region 12 is not exposed, thus reducing the possibility that the channel region 12 will be contaminated by a harmful impurity.

The semiconductor memory device according to the first embodiment also have the advantage which will be discussed below.

In the device shown in FIGS. 1 and 2, as the channel regions of the memory cell transistors adjoining in the row direction are isolated from each other by the LOCOS oxide film 8, a bird's beak contacts the channel region. Therefore, the quality of the gate oxide film 2 is degraded in the vicinity of the contact portion between the channel region and the bird's beak of the LOCOS oxide film 8. In an EEPROM or flash EEPROM, for example, a high electric field is applied to the gate oxide film 2 for the flow of the tunnel current to inject electrons to the floating gate 3 or discharge the electrons therefrom. If the quality of the gate oxide film 2 is poor, therefore, the dielectric breakdown of the gate oxide film 2 may occur relatively early, adversely affecting the reliability of the device.

According to the device shown in FIGS. 3 through 5, however, the channel regions 12 are isolated from each other by the diffusion layer 13 having a high concentration, not the LOCOS oxide film, so that the deterioration of the quality of the gate oxide film 2 is overcome. Because the quality of the gate oxide film 2 is not deteriorated, the device according to the first embodiment therefore has a longer life and a higher reliability of the memory cell transistors than the device shown in FIGS. 1 and 2.

The known trench isolation type device has its floating gates separated by the trench isolation. Therefore, the control gate (WL) faces only with the top surface of the floating gate, thus reducing the coupling ratio between the control gate (WL) and the floating gate. This decreases the amount of the drain current per channel width, reducing the driving performance of the memory cell transistors.

In the device shown in FIGS. 3 through 5, however, the channel regions 12 are not separated by the trench 11. Therefore, the control gate WL can face with the top surface as well as the side surface of the floating gate, thus permitting the coupling ratio between the control gate and the floating gate to be greater than that of the known trench isolation type device. The device according to the first embodiment can therefore increase the amount of the drain current per channel width, thus improving the driving performance of the memory cell transistors. The improved driving performance of the memory cell transistors will result in faster data writing.

The structure of the device shown in FIGS. 3 to 5 allows this coupling ratio to be adjusted by changing the thickness of the floating gate 3. If the floating gate 3 is made thicker, for instance, the coupling ratio can be increased.

In the known trench isolation type device, because not only the floating gates but also the source diffusion layers are separated by the trench isolation, it is necessary to connect the source diffusion layers by a wiring layer later. As a result, while the memory cell matrix is reduced in the row direction, the size reduction in the column direction is difficult because of the necessity to provide the contact region for the source diffusion layer for each memory cell transistor.

According to the device shown in FIGS. 3 to 5, however, the source diffusion layers 7 are not separated by the trench 11, allowing each source diffusion layer 7 to be shared by the memory cell transistors MC in the associated row and those in one adjoining row. Because of no contact region necessary for the source diffusion layer per memory cell transistor, the device according to the first embodiment can reduce the size in the column direction more than the known trench isolation type device.

A method of fabricating the semiconductor memory device according to the first embodiment will be described below.

FIGS. 6A through 6G are step-by-step perspective views illustrating the semiconductor memory device according to the first embodiment in the main steps.

First, device isolation regions are formed by the LOCOS method in the surface region of the P-type silicon substrate 1 for peripheral circuits, such as a row decoder and a column decoder (not shown). The device isolation regions (LOCOS oxide film) need not be formed in the memory cell matrix 10.

After the LOCOS oxide film (not shown) for isolating devices constituting the peripheral circuits are formed, the first gate oxide film 2 having a thickness of about 10 nm is formed on the surface of the substrate 1, as shown in FIG. 6A. Then, silicon doped with an N-type impurity (e.g., phosphorous) is deposited on the first gate oxide film 2, yielding the first polysilicon film 3 about 200 nm in thickness. Next, the first polysilicon film 3 is patterned through a photolithography step and an etching step to have a stripe shape so that the channel widths of the memory cell transistors will be defined. At this time, the width E of the remaining first polysilicon film 3 is the width in the direction of the channel width of the floating gate, and the width F of the eliminated portion of the first polysilicon film 3 is the width of the region for isolating the adjoining memory cell transistors in the row direction. The width F can be reproduced with the minimum lithography size. Then, with a photoresist film (not shown) left on or removed from the first polysilicon film 3, a P-type impurity (e.g., boron) is injected in the substrate 1 to yield the high-concentration diffusion layer 13 for preventing the generation of a leak current between the drain and source. At this time, the P-type impurity is injected, substantially self-aligned with the first polysilicon film 3.

Figure 6B:
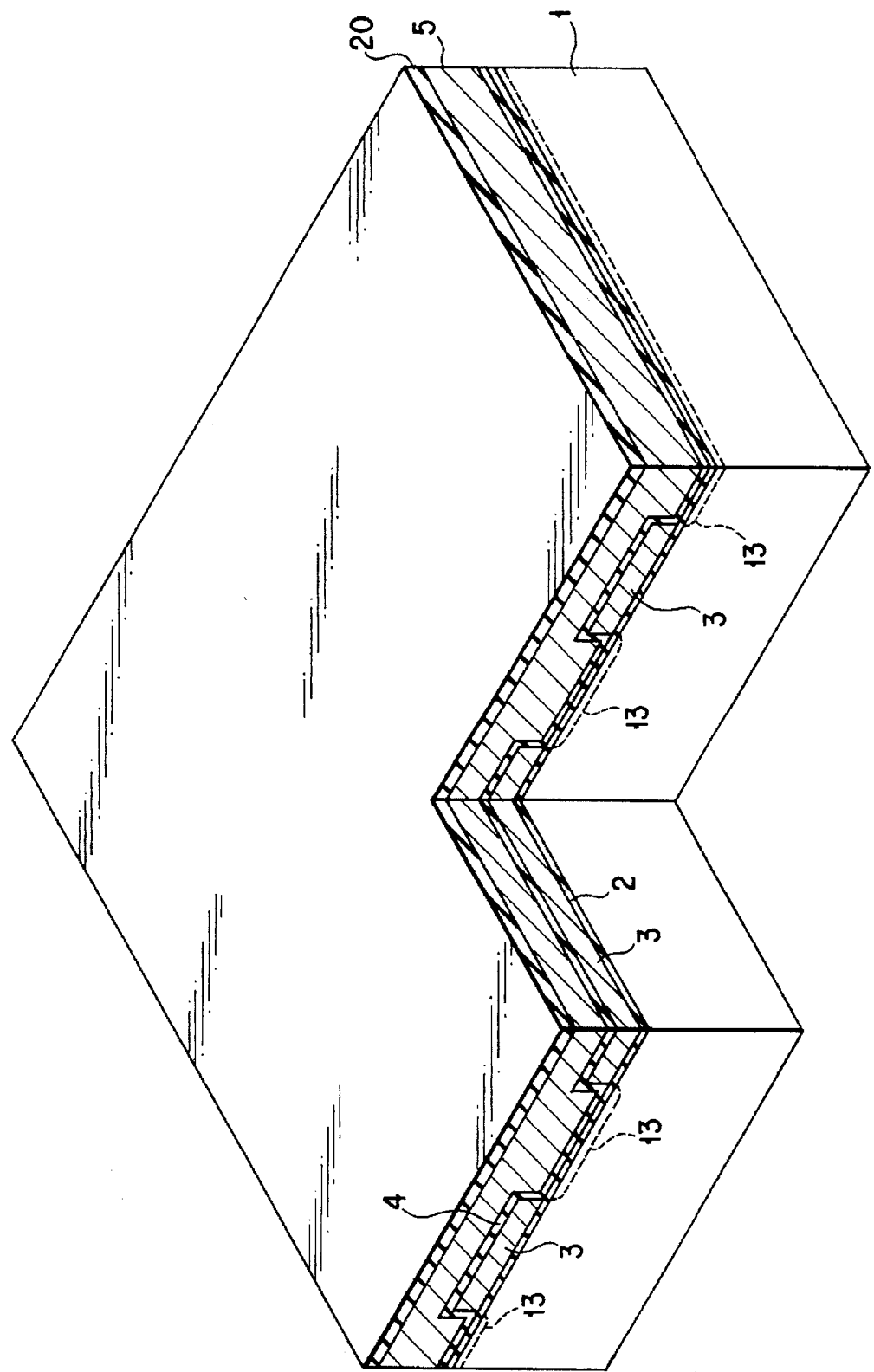

Next, as shown in FIG. 6B, the second gate insulating film 4 is formed on the structure of FIG. 6A. This insulating film 4 generally has a three-layer structure of a silicon dioxide film/silicon nitride film/silicon dioxide film. Then, silicon doped with an N-type impurity (e.g., phosphorous) is deposited on the second gate insulating film 4, yielding the second polysilicon film 5 about 400 nm in thickness. This second polysilicon film 5 will serve as a control gate (word line). Then, silicon dioxide is deposited on the second polysilicon film 5 by the CVD method, yielding a silicon dioxide film 20 having a thickness of about 100 nm.

Then, as shown in FIG. 6C, a photoresist is coated on the structure of FIG. 6B and the resultant structure is patterned using the photolithography method to yield a resist film 21 of a stripe shape separated along the channel width of the memory cell transistor. The pattern obtained by the resist film 21 corresponds to a pattern of the word lines. Next, with the resist film 21 used as a mask, the silicon dioxide film 20, second polysilicon film 5 and second gate insulating film 4 are etched in order. As a result, the first gate oxide film 2 or the first polysilicon film 3 is exposed where the resist film 21 is not present.

Figure 6D:
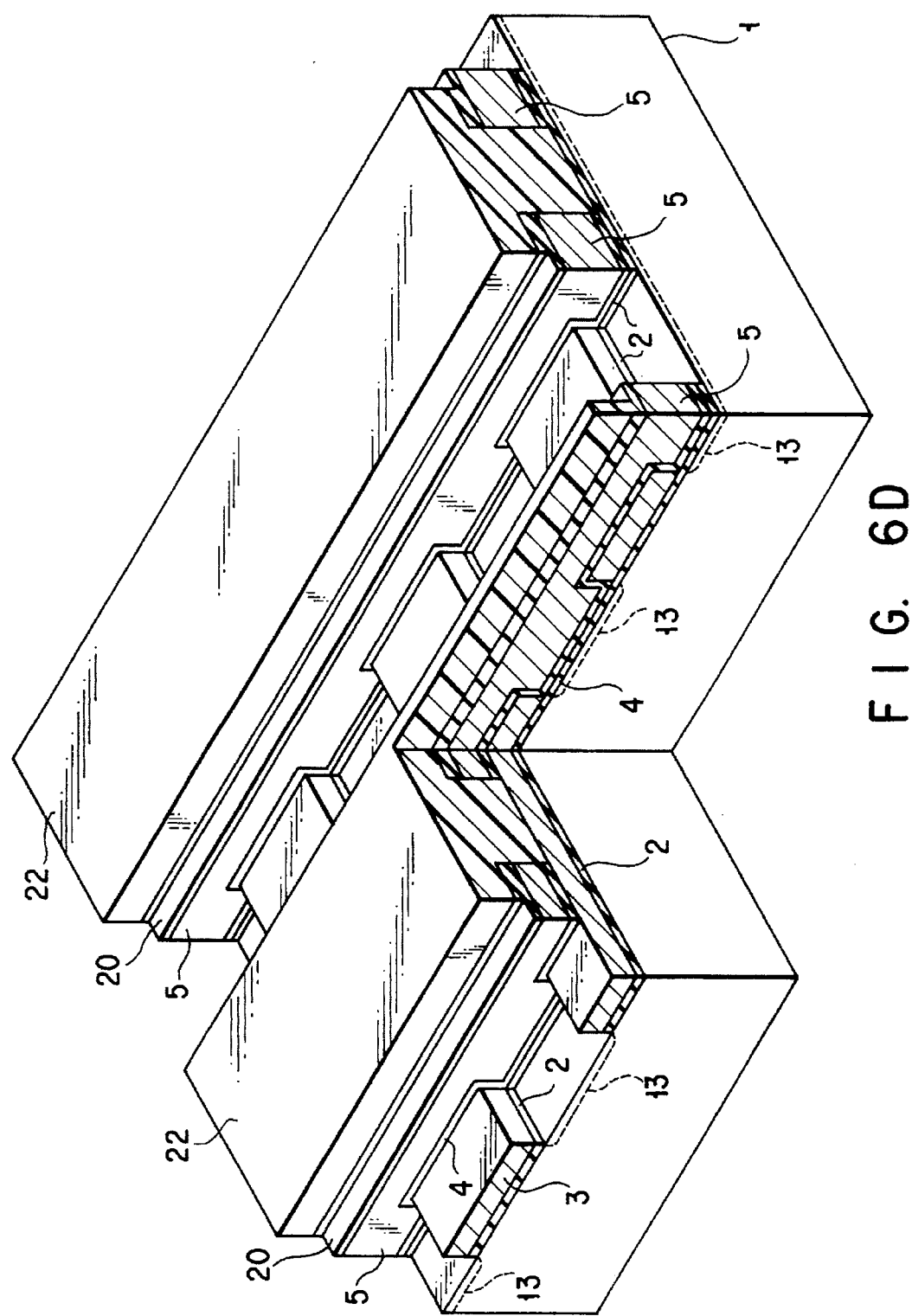

As shown In FIG. 6D, after the resist film 21 is removed, a new photoresist is coated on the structure of FIG. 6C and the resultant structure is patterned using the photolithography method to yield a striped resist film 22 which is formed to cover the region that will serve as a source diffusion layer. Then, the first gate oxide film 2 is etched out using an etchant which ensures easy etching of silicon dioxide and makes etching of silicon difficult, and using the resist film 22 and the first polysilicon film 3 as masks. This causes the surface of the substrate 1 to be exposed at the region which will serve as the isolation region. As the resist film 22 is formed above the second polysilicon film 5 with an alignment margin secured, there is a portion where the dioxide film 20 is exposed. Accordingly, etching of the dioxide film 20 progresses at the same time as the first gate oxide film 2 is etched. Since the dioxide film 20 is made thicker than the first gate oxide film 2, the second polysilicon film 5 will not be exposed.

Figure 6E:
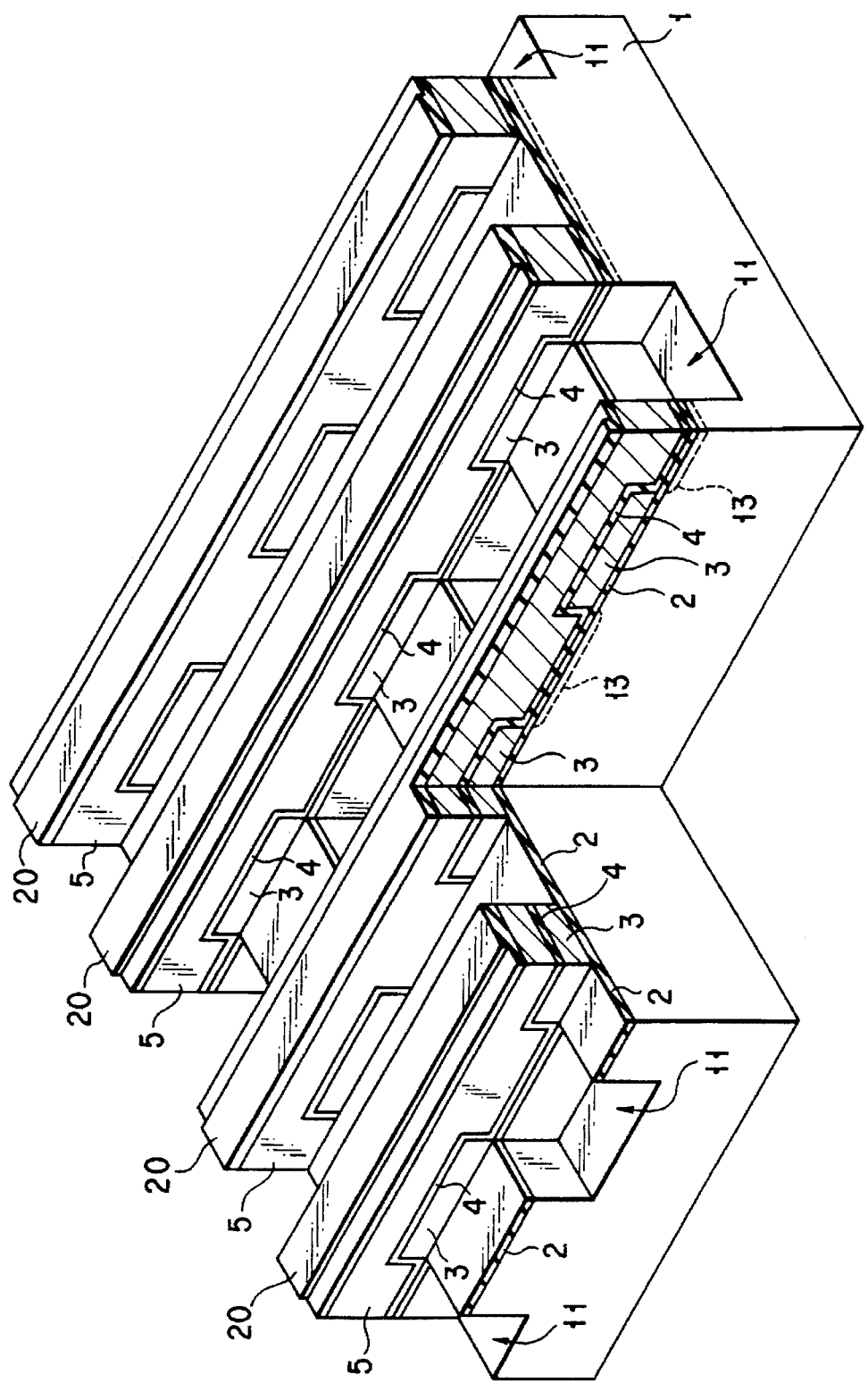

As shown in FIG. 6E, after the resist film 22 is removed, the exposed surface of the substrate 1 is etched and the first polysilicon film 3 is removed by using an etchant which ensures easy etching of silicon and makes the etching of silicon dioxide difficult, and using as a mask the first gate oxide film 2 remaining on the region where the source diffusion layer will be formed. At this time, the high-concentration diffusion layer 13 is also removed by etching the surface of the substrate 1. As the first gate oxide film 2 serves as an etching stopper, the etching of the first polysilicon film 3 will be ended when the first gate oxide film 2 is exposed. Accordingly, the first gate oxide film 2 is exposed at the region where the drain diffusion layer will be formed, while the trench 11 having a depth desirable for self-alignment with the end portion of the floating gate and the region where the drain diffusion layer will be formed, is formed in the region which is surrounded by the control gate 5 and that region where the drain diffusion layer is to be formed, as viewed from the plane. That is, since the end portion of the trench 11 is positioned in self-alignment with both ends of the floating gate 3, the trench 11 will be formed in self-alignment with the region where the drain diffusion layer will be formed. Further, since the first polysilicon film 3 is partially removed, the first polysilicon film 3 of a stripe shape is separated to be the floating gates of the memory cell transistors.

Figure 6F:
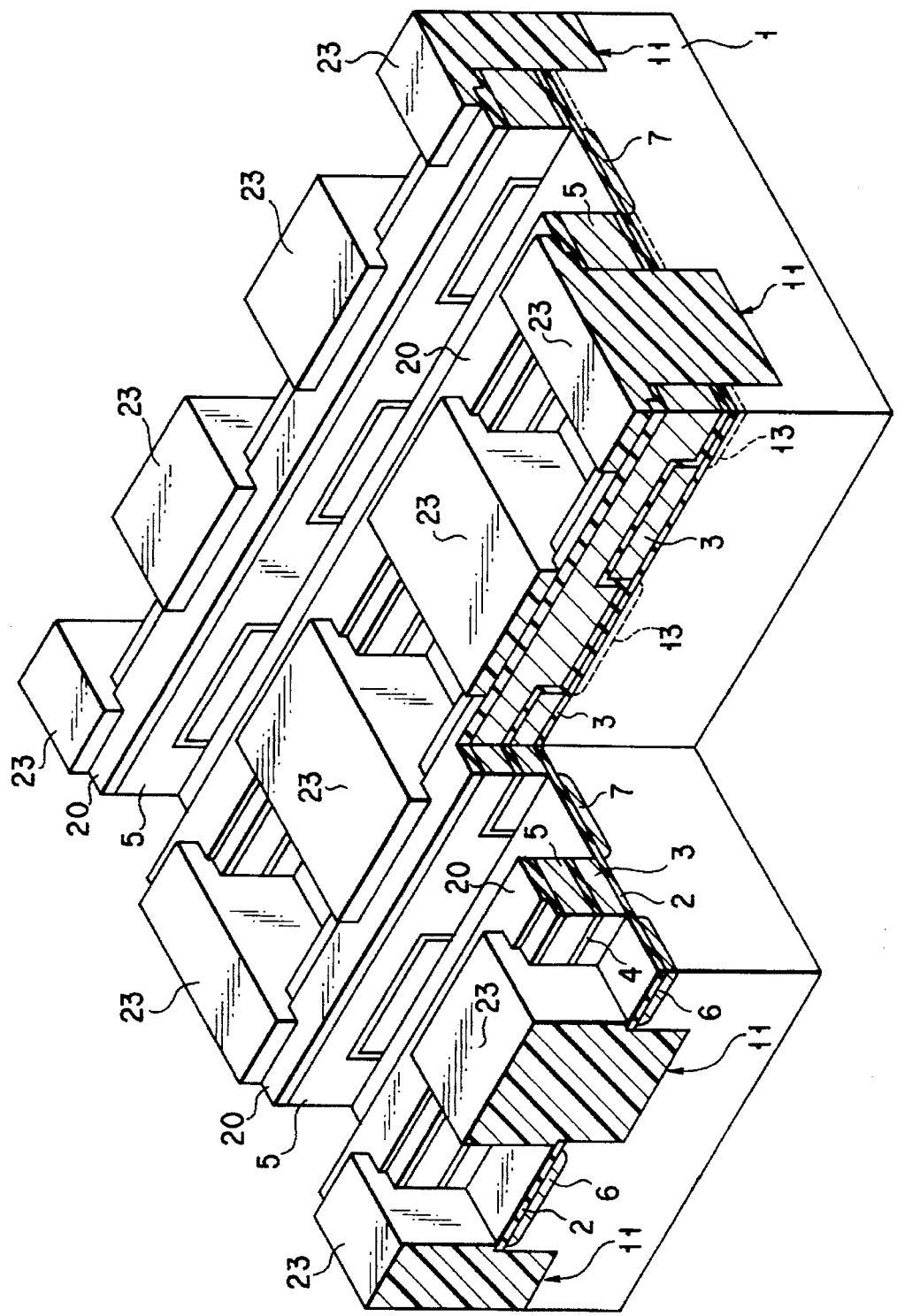

Next, as shown in FIG. 6F, a photoresist is coated on the structure of FIG. 6E and a resist film 23 of a island shape which covers each trench 11 is yielded using the photolithography method. Then, an N-type impurity (e.g., arsenic) is injected in the substrate 1 via the first gate oxide film 2 with the resist film 23 and dioxide film 20 used as masks, yielding the island-shaped drain diffusion layer 6 and the striped source diffusion layer 7.

Figure 6G:
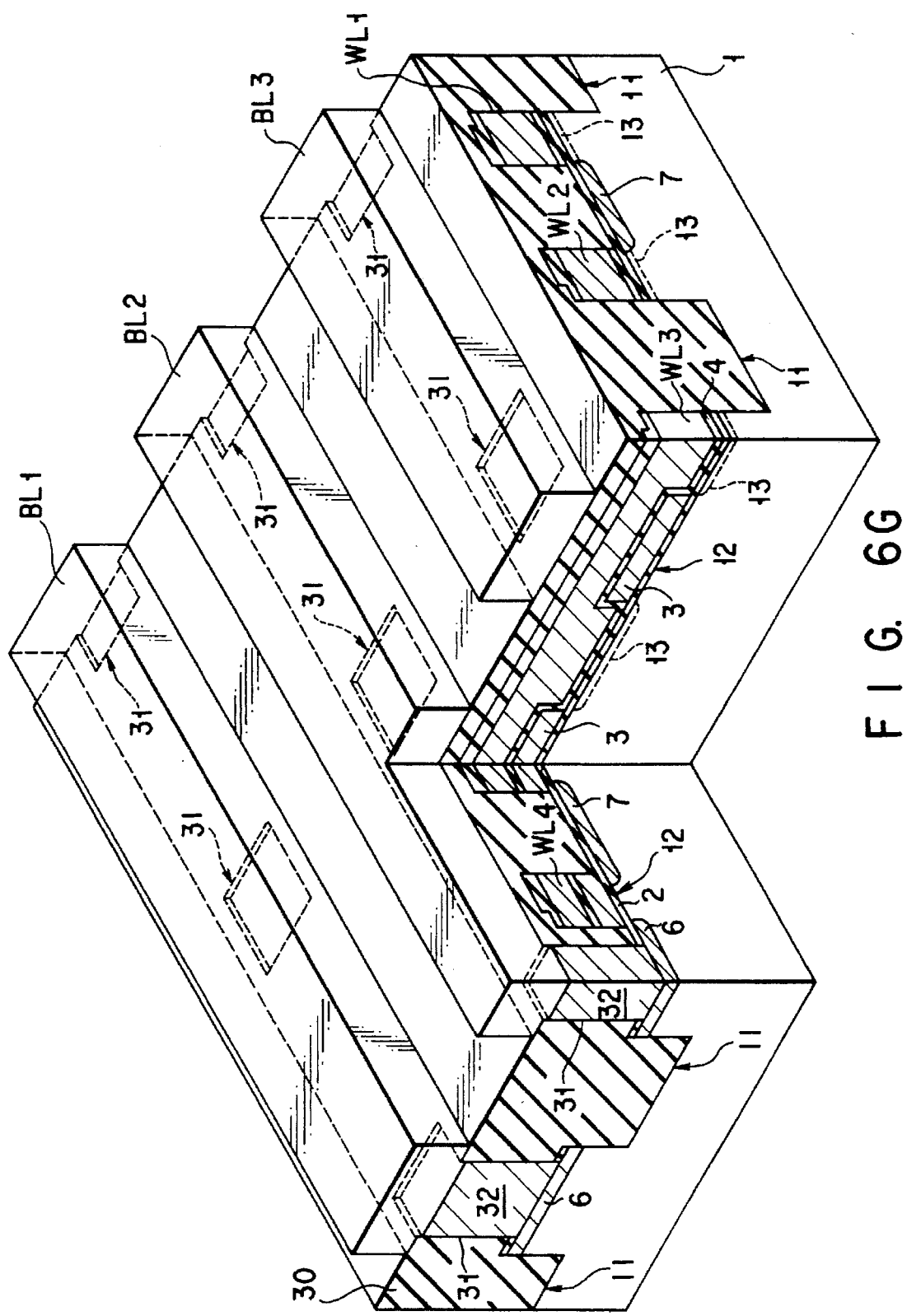

Next, as shown in FIG. 6G, after the resist film 23 is removed, silicon dioxide or the like is deposited on the structure of FIG. 6F using the CVD method, causing each trench 11 to be buried with the silicon dioxide or the like and yielding an interlayer insulating film 30 which insulatively isolates the internal wiring layers, such as the control gates 5, from each other. Then, the selected portion of the interlayer insulating film 30 is removed through a photolithography step and an etching step, thus forming a contact hole 31 which reaches each drain diffusion layer 6. Then, the contact hole 31 is buried with a conductor 32, such as tungsten. This conductor 32 is electrically connected to the drain diffusion layer 6. Then, bit lines BL1 to BL3, which are to be electrically connected to the conductor 32, are formed of aluminum or the like.

Since the control gates 5 in FIG. 6G correspond to word lines WL1 to WL4 in FIG. 3, they will be denoted by reference numerals "WL1" to "WL4" instead of "5."

Through the above-described fabrication method, the semiconductor memory device according to the first embodiment of this invention will be manufactured.

Another method of fabricating the semiconductor memory device according to the first embodiment will be described below. FIGS. 7A through 7E are step-by-step perspective views illustrating the semiconductor memory device according to the first embodiment in the main steps according to the second method.

According to the fabrication method which has been explained with reference to FIGS. 6A to 6G, after the etching of the second gate insulating film 4 is complete, the first gate oxide film 2 remains. Generally, the first gate oxide film 2 and the second gate insulating film 4 are both thin and are made of similar materials. After the second gate insulating film 4 is etched, therefore, part of the first gate oxide film 2 may be eliminated. This problem can be sufficiently coped with by the state-of-the-art technology by controlling the thicknesses of the first gate oxide film 2 and the second gate insulating film 4 at high precision and severely monitoring the etching amount. Further, the problem can also be coped with by changing the materials for the first gate oxide film 2 and the second gate insulating film 4 to materials which will permit the etching ratio to be selected.

The fabrication method which will be discussed below is an improved method which will relatively easily fabricate the device shown in FIGS. 3 through 5 without requiring high-precision thickness control, severe monitoring of the etching amount, or a significant change in the materials for the first gate oxide film 2 and the second gate insulating film 4.

First, the structure shown in FIG. 7A is obtained by the method which has already explained referring to FIGS. 6A–6C. As shown in FIG. 7A, the first gate oxide film 2, which has remained in FIG. 6C, is removed, so that the surface of the substrate 1 is exposed through a part of the region which will become the isolation region and a part of the region which will become the source diffusion layer.

Figure 7B:
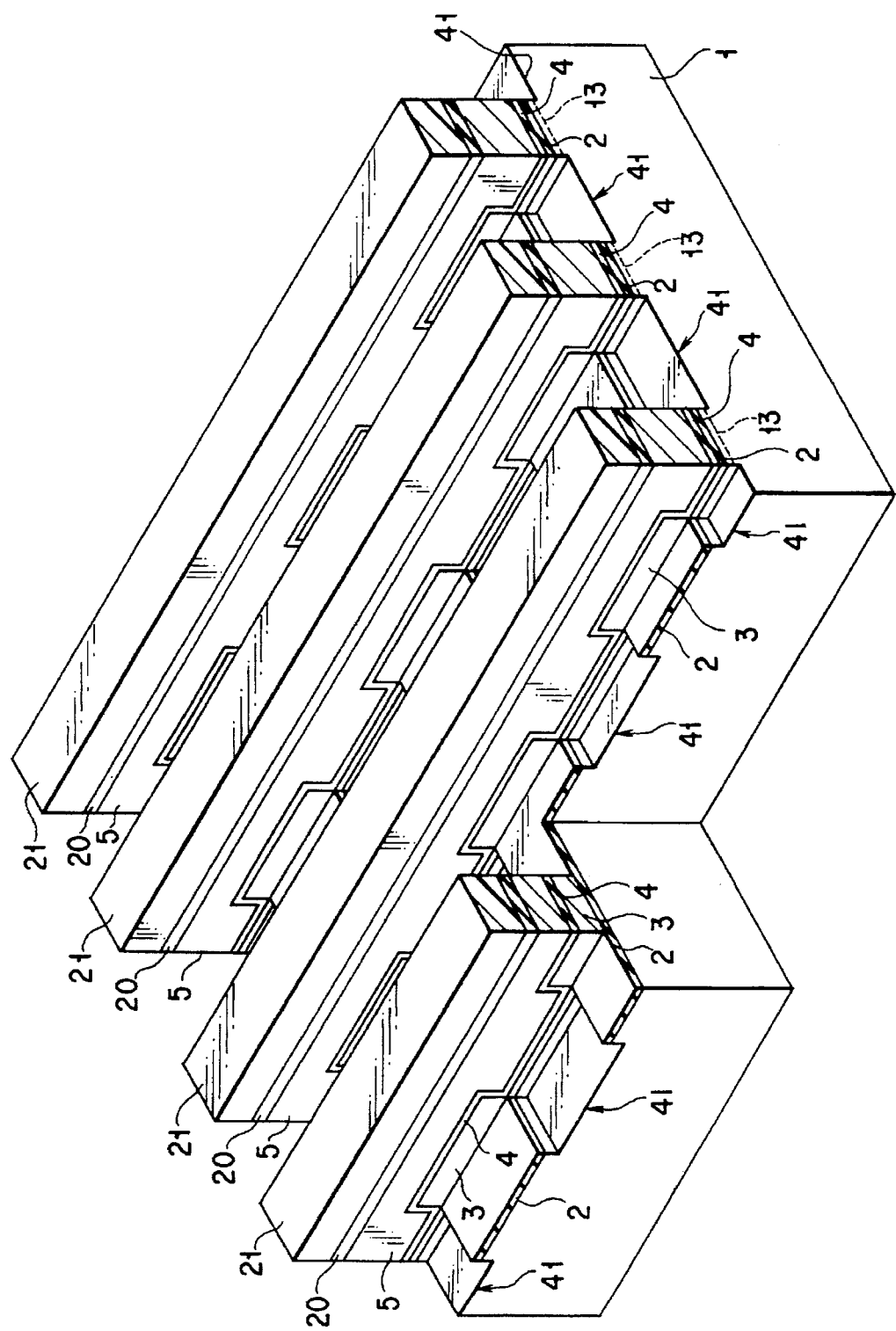

Then, as shown in FIG. 7B, with the resist film 21 left and used as a mask, the first polysilicon film 3 is etched out. At this time, the substrate 1 is etched at the portion where the surface of the substrate 1 is exposed, thus forming a shallow groove 41. If the first polysilicon film has a thickness of about 200 nm, the shallow groove 41 is about 100 nm deep. This is because an N-type impurity (e.g., phosphorous) is doped in the first polysilicon film 3, thus making the etching of the first polysilicon film 3 faster than the etching of the substrate 1 which is made of P-type single crystalline silicon.

Figure 7C:
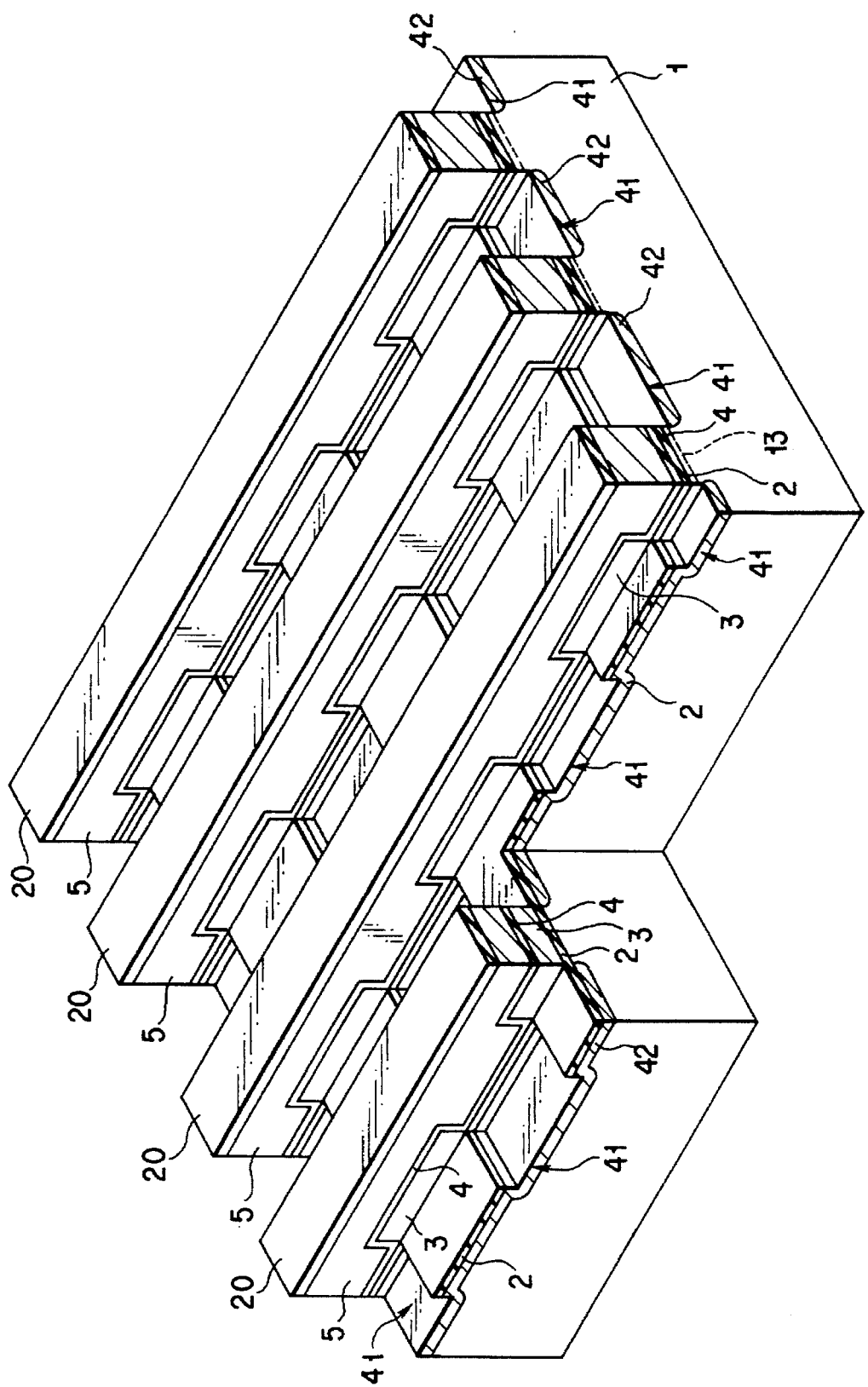

Next, after the resist film 21 is removed (the resist film 21 should not necessarily be removed), an N-type impurity (e.g., arsenic) is injected in the substrate 1, yielding a striped N-type diffusion layer 42, as shown in FIG. 7C. At this time, the N-type impurity is injected in the substrate 1 via the first gate oxide film 2 at the portion where the first gate oxide film 2 is formed on the surface of the substrate 1. At the step portion formed by the shallow groove 41, the N-type diffusion layer 42 can be yielded by diffusion of the N-type impurity caused by a later heat treatment because the step is as small as about 100 nm. Thus, the N-type diffusion layer 42 will automatically have a stripe shape.

Figure 7D:
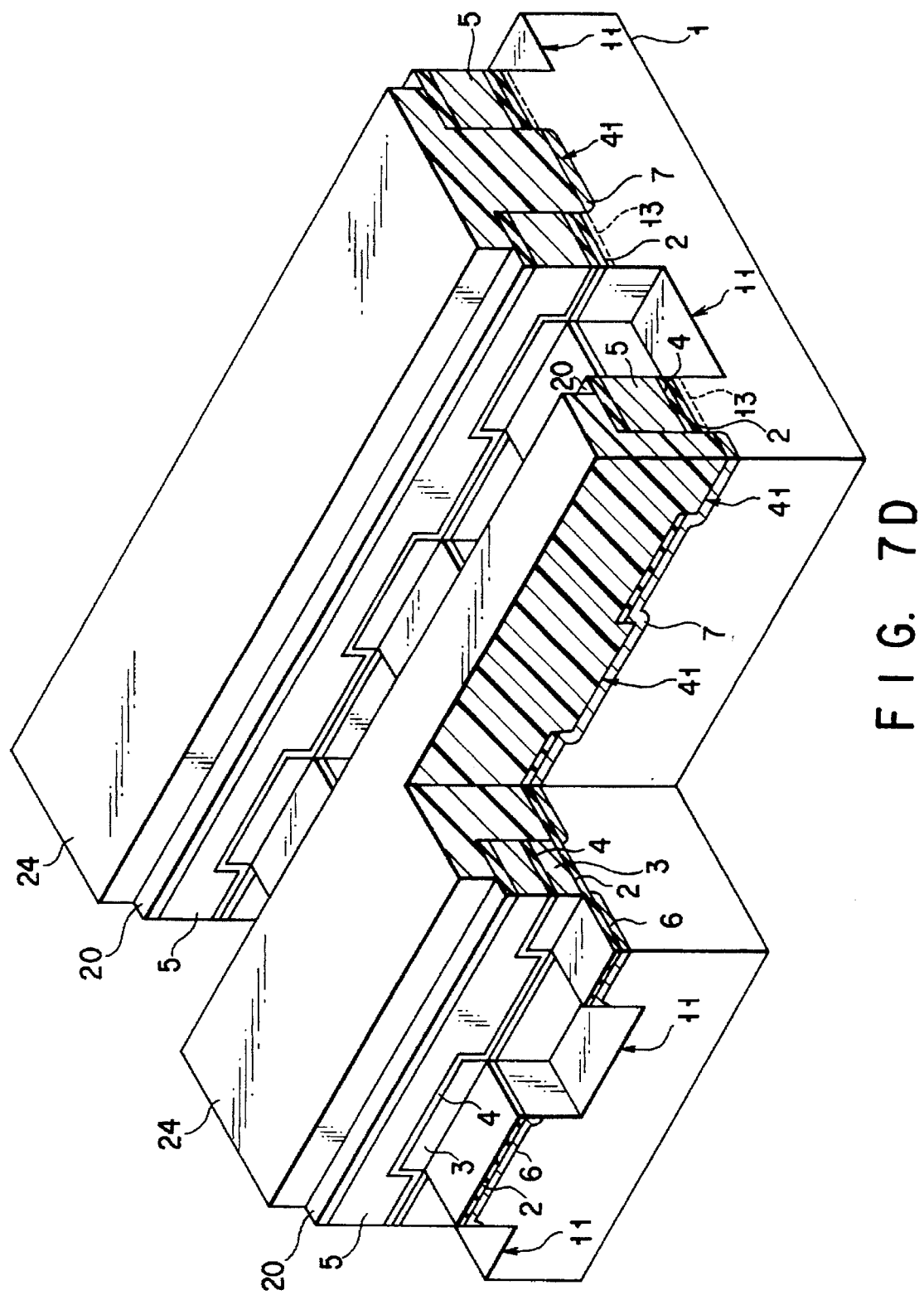

Then, as shown in FIG. 7D, a photoresist is coated on the structure of FIG. 7C and the resultant structure is patterned using the photolithography method to yield a striped resist film 24 formed to cover the region which will become the source diffusion layer. Then, the surface of the substrate 1 exposed to the bottom of the shallow groove 42 which is not covered with the resist film 24 is etched by using an etchant, which ensures easy etching of silicon and makes the etching of silicon dioxide difficult, and using as masks the resist film 24, the first gate oxide film 2 and a part of the dioxide film 20. At this time, the N-type diffusion layer 42 is also removed by etching the surface of the substrate 1. As a result, the trench 11 having the desired depth is formed in the region to be the isolation region. The formation of the trench 11 separates the region which will become the drain diffusion layer as islands. Therefore, the N-type diffusion layer 42 shown in FIG. 13 is separated as islands to be the drain diffusion layers 6. The N-type diffusion layer 42 covered by the resist film 24 remains striped to become the source diffusion layers 7.

Then, as shown in FIG. 7E, after the resist film 24 is removed, silicon oxide or the like is deposited on the structure of FIG. 7D using the CVD method to yield the interlayer insulating film 30, and the contact hole 31 is formed in the selected portion of the interlayer insulating film 30 by the same method as has been explained referring to FIG. 6G. After the contact hole 31 is buried with the conductor 32, such as tungsten, the bit lines BL1 to BL3 of aluminum are formed on the interlayer insulating film 30.

Since the control gates 5 in FIG. 7E as in FIG. 6G correspond to word lines WL1 to WL4 in FIG. 3, they will also be denoted by reference numerals "WL1" to "WL4" instead of "5."

Through the above-described fabrication method, the semiconductor memory device according to the first embodiment of this invention will also be manufactured.

A description will now be given of a semiconductor memory device according to the second embodiment of this invention.

Figure 8:
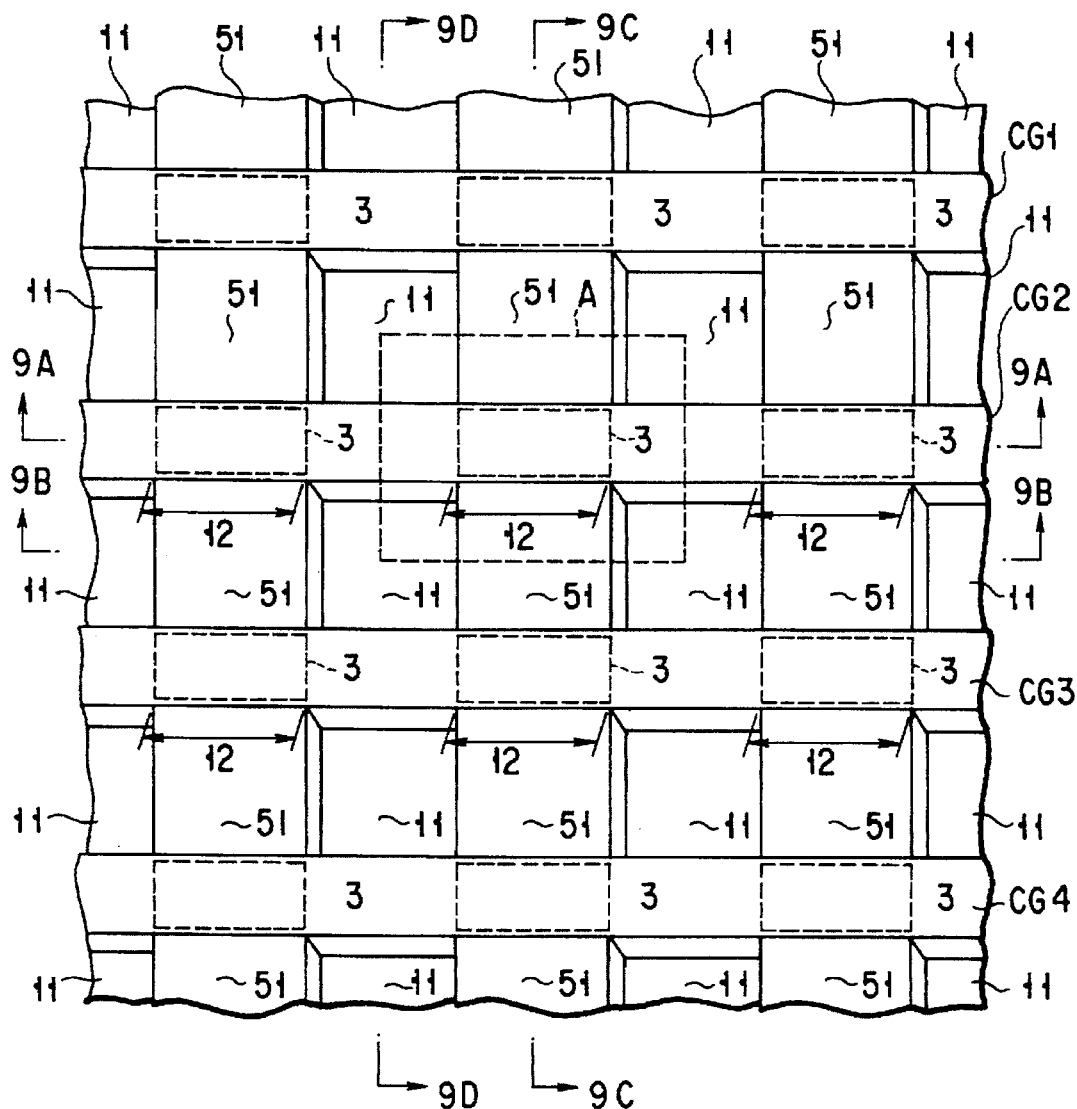
FIG. 8 is a plan view of the basic pattern of the memory cell matrix of a semiconductor memory device according to a second embodiment of this invention.
Figure 10:
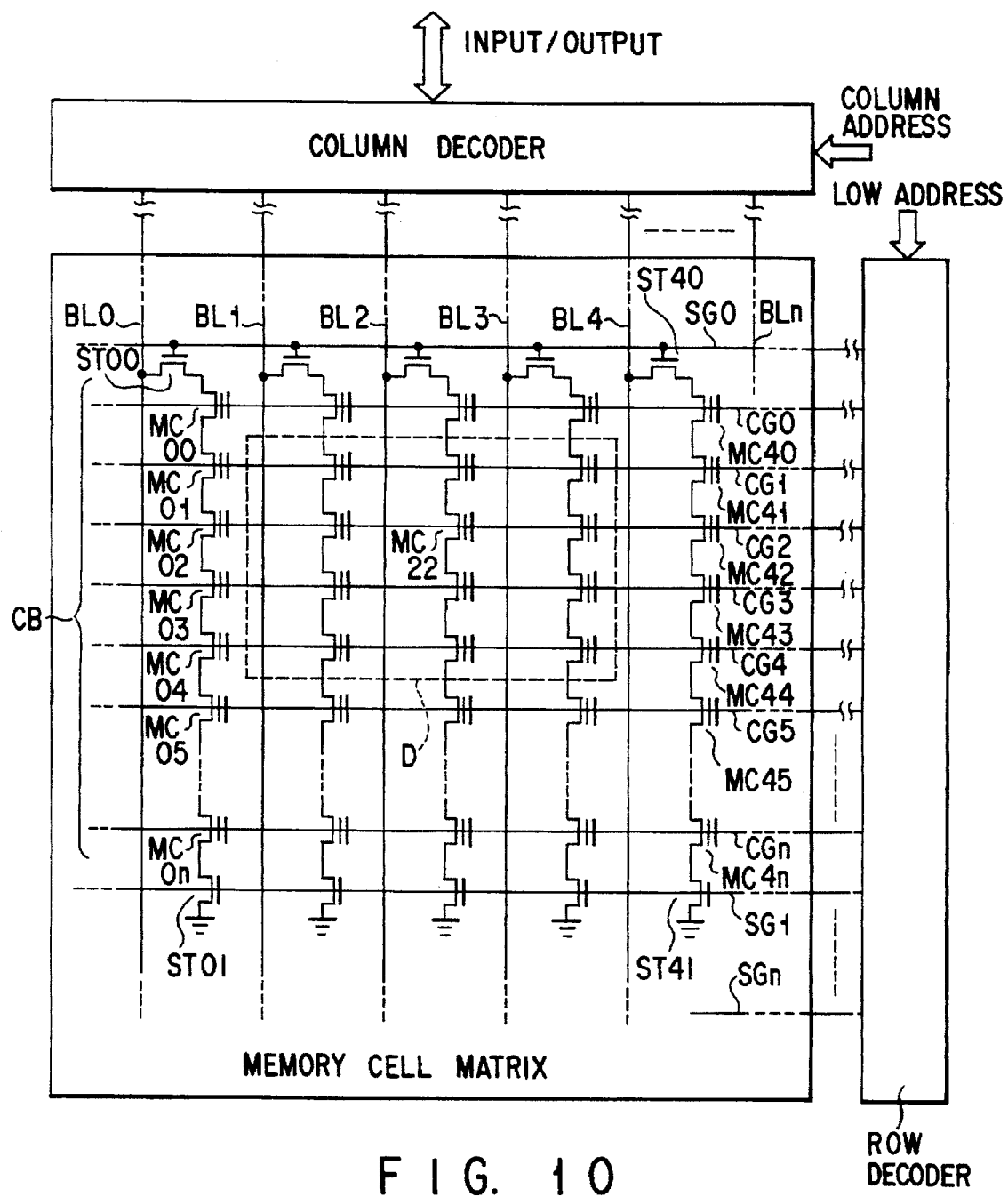
FIG. 10 is a schematic block diagram of a semiconductor memory device according to the second embodiment of this invention.

FIG. 8 is a pattern plan view showing the basic pattern of the memory cell matrix of a flash EEPROM to the second embodiment of this invention. FIG. 9A is a cross-sectional view taken along line 9A—9A in FIG. 8, FIG. 9B is a cross-sectional view taken along line 9B—9B in FIG. 8, FIG. 9C is a cross-sectional view taken along line 9C—9C in FIG. 8, and FIG. 9D is a cross-sectional view taken along line 9D—9D in FIG. 8. FIG. 10 is a schematic block diagram of the semiconductor memory device according to the second embodiment of this invention. The pattern plan view of FIG. 8 corresponds to the portion indicated by the block D in FIG. 10.

The first embodiment of the flash EEPROM having a single cell transistor connected between the associated bit line and the source as shown in FIG. 5 is called a NOR type.

In the second embodiment, the present invention is applied to a NAND type flash EEPROM having a plurality of cell transistors connected in series between the associated bit line and the source, instead of the NOR type.

As shown in FIGS. 8 through 10, a memory cell matrix 10 is provided in a P-type silicon substrate 1, with a plurality of memory cell transistors MC00 to MC4n arranged in a matrix form in this memory cell matrix 10. Each of the memory cell transistors MC00 to MC4n is constituted of an insulating gate type FET having a floating gate electrode between the gate electrode and channel region to change a threshold value. This device further comprises n control gates (corresponding to word lines) CG0 to CGn, n rows constituting a single block CB. Columns in the block CB are respectively connected to bit lines BL0 to BLn via a first group of select transistors ST00 to ST40, and are grounded via a second group of select transistors ST01 to ST41. The gates of the first select transistors ST00 to ST40 are connected to a first select gate line SG0, and the gates of the second select transistors ST01 to ST41 are connected to a second select gate line SG1. The select transistors ST each are constituted of an ordinary insulating gate type FET which has only an insulating layer provided between the gate electrode and the channel region.

The broken-line block A in FIG. 8 indicates the area of a single memory cell transistor MC22. Each of the memory cell transistors MC00 to MC4n comprises a first gate oxide film 2 formed of silicon dioxide on the substrate 1, a floating gate 3 formed of polysilicon on this first gate oxide film 2, a control gate CG (word lines WL0-WLn) formed on the floating gate 3 via a second gate insulating film 4 (which is generally called "interpoly insulating film"), a plurality of N-type drain diffusion layers 51 of a land shape, which electrically connect channel regions 12 of each column of memory cell transistors to one another. The N-type diffusion layers 51 are connected to both ends of the channel region 12 of one memory cell transistor MC, and serve as both the source and drain of one memory cell transistor MC. A trench 11 is formed in that portion of the substrate 1 which lies between the diffusion layers 51 of those memory cell transistors MC adjoining in the row direction. This trench 11 will not be formed substantially in that portion of the substrate 1 which lies between the channel regions 12 of those memory cell transistors MC adjoining in the row direction, as shown particularly in FIGS. 4A through 4D. A P-type diffusion layer 13 having a higher concentration than the substrate 1 is formed in that portion of the substrate 1 which lies between the channel regions 12. Those diffusion layers 13, like the one explained in the section of the first embodiment, are provided to always set off parasitic transistors each having the control gate CG as its gate.

According to the semiconductor memory device of the second embodiment, since those diffusion layers 51 of the memory cell transistors MC adjoining in the row direction, which each serve as both the source and drain, are isolated from each other by the trench 11, bird's beaks of the LOCOS oxide film will not be produced. The isolation distance between the diffusion layers 51 can thus be reduced to the minimum lithography size.

Since the trench 11 is not formed along the channel region 12, as in the first embodiment, a leak current will hardly be produced along the side surface of the trench 11 from the channel region. Further, since various stresses originated from the trench 11 are not applied directly to the channel region 12 during fabrication, a stress-originated reduction in reliability of memory cell transistors will hardly occur. Further, the channel region 12 is not exposed, thus reducing the possibility that the channel region 12 will be contaminated by a harmful impurity. It is needless to say that the second embodiment will provide the same advantages as the first embodiment.

A method of fabricating the semiconductor memory device according to the second embodiment will be described below.

FIGS. 11A through 11D are step-by-step perspective views showing the semiconductor memory device according to the second embodiment in the main steps.

Figure 11A:
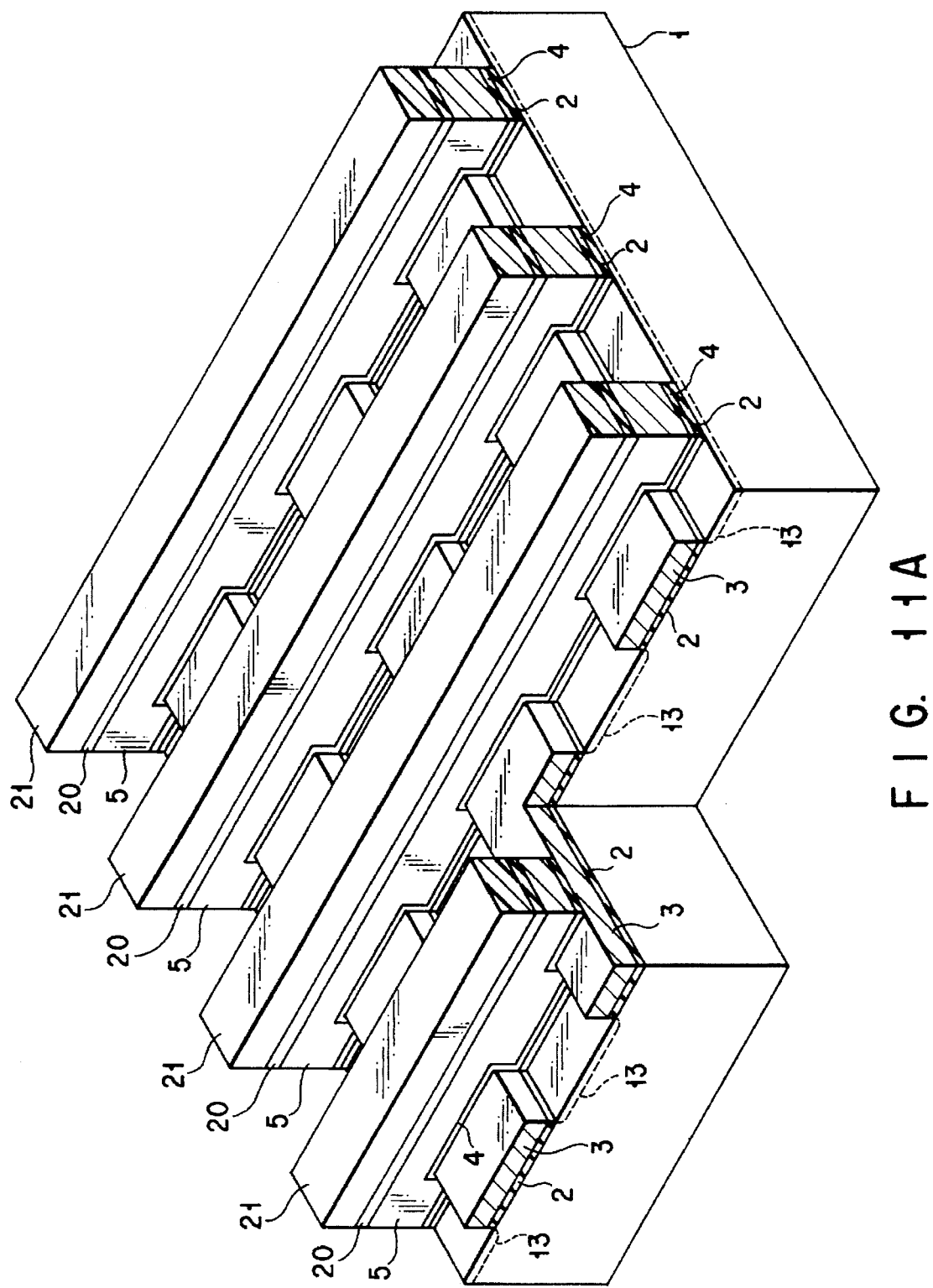
FIGS. 11A through 11D are perspective views of the semiconductor memory device according to the second embodiment of this invention in main steps of fabricating the same.

First, the structure shown in FIG. 11A is obtained by the method which has been explained with reference to FIGS. 6A to 6C. After the second gate insulating film 4 is removed, the first gate oxide film 2 present on the region which is to be the isolation region is also removed, thus exposing the surface of the substrate 1 in this region, as shown in FIG. 11A.

Figure 11B:
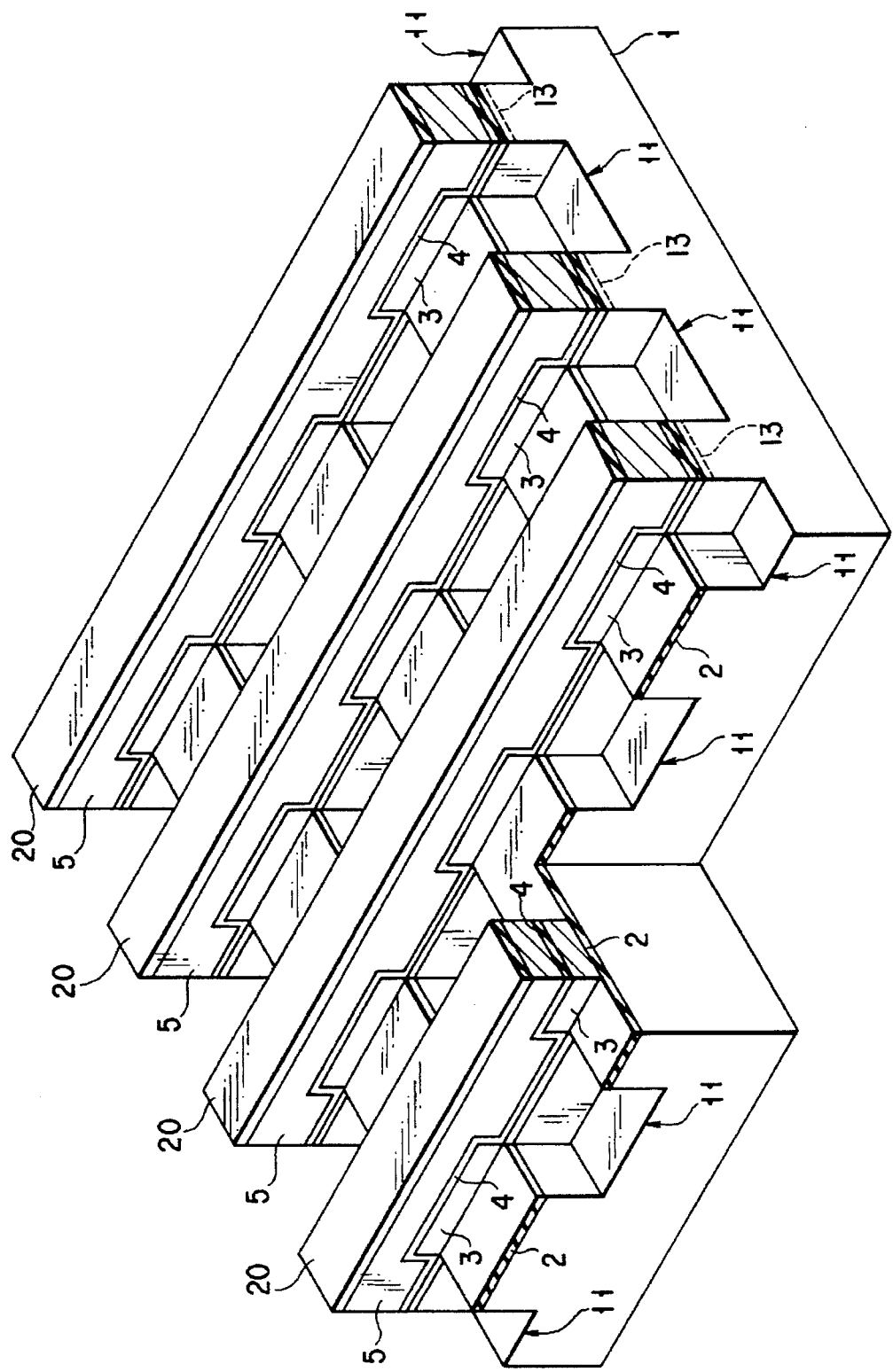

Then, as shown in FIG. 11B after the resist film 21 is removed, the exposed surface of the substrate 1 is etched and the first polysilicon film 3 is removed by using an etchant which ensures easy etching of silicon and makes the etching of silicon dioxide difficult, and using the dioxide film 20 as a mask. At this time, as the surface of the substrate 1 is etched, the heavily dope diffusion layer 13 is removed. Because the first gate oxide film 2 serves as an etching stopper, the etching of the first polysilicon film 3 will be ended when the first gate oxide film 2 is exposed as in the case of the method of the first embodiment which has been explained referring to FIG. 6E. Accordingly, the first gate oxide film 2 is exposed at the region where the diffusion layer serving as the source and drain will be formed, while the trench 11 having a desirable depth is formed in the region surrounded by the control gate 5 and that region where the diffusion layer is to be formed, as viewed from the plane. This trench 11 is self-aligned with that region where the diffusion layer is to be formed. Further, since the first polysilicon film 3 is partially removed, the first polysilicon film 3 of a stripe shape is separated to be the floating gates of the memory cell transistors.

Figure 11C:
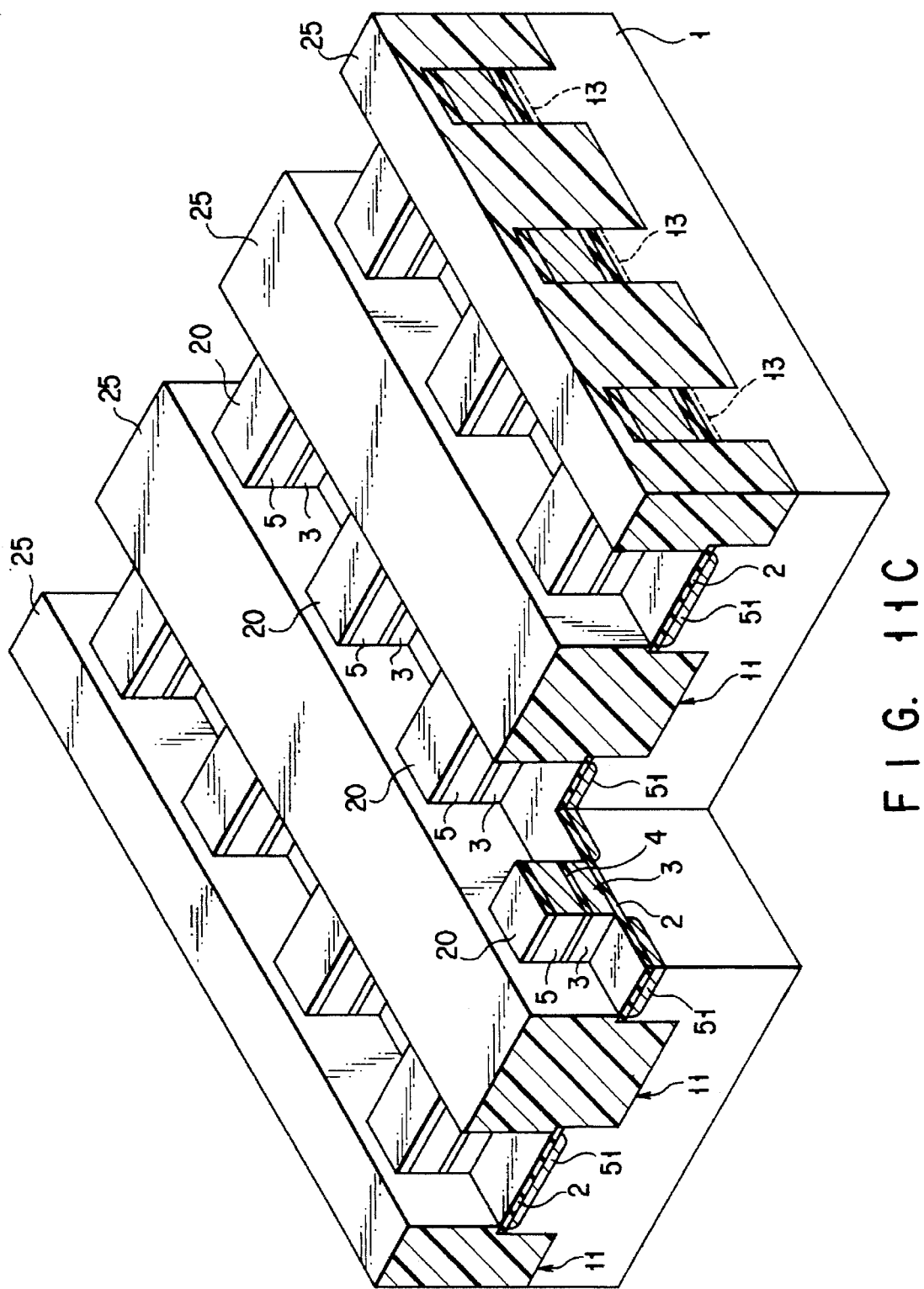

Then, as shown in FIG. 11C, a photoresist is coated on the structure of FIG. 11B and the resultant structure is patterned using the photolithography method to yield a striped resist film 25 which covers the trenches 11 for each column. Next, with the resist film 25 and the dioxide film 20 used as masks, an N-type impurity (e.g., arsenic) is injected in the substrate 1 via the first gate oxide film 2, yielding a island-shaped diffusion layer 51 which serves as both the source and drain.

Figure 11D:
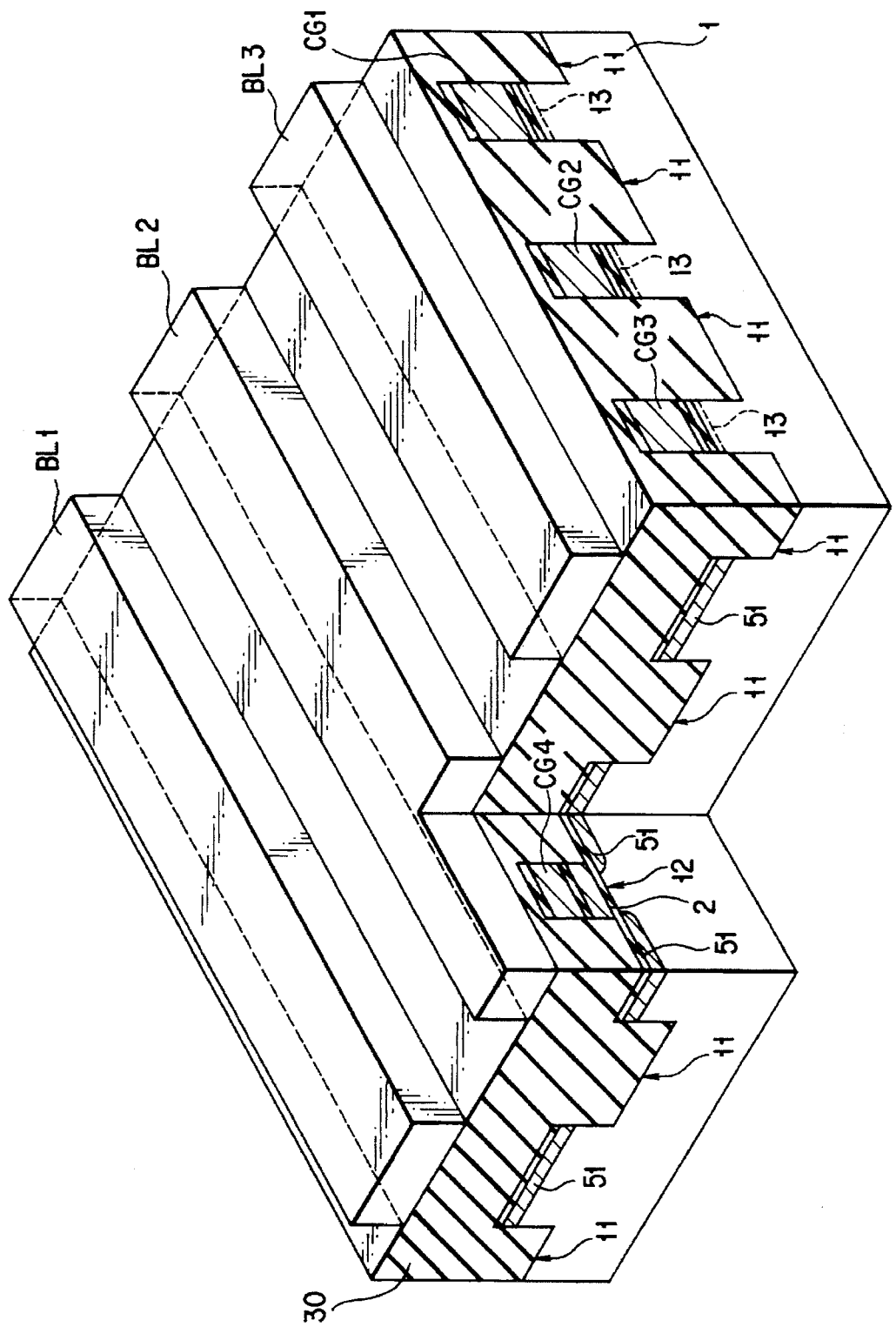

Next, as shown in FIG. 11D, after the resist film 25 is removed, silicon dioxide or the like is deposited on the structure of FIG. 11C using the CVD method, yielding an interlayer insulating film 30, and a contact hole (not shown) is formed in the selected portion of the interlayer insulating film 30 by the same fabrication method as explained with reference to FIG. 6G. Then, after the contact hole is buried with a conductor (not shown), such as tungsten, bit lines BL1 to BL3 of aluminum or the like are formed on the interlayer insulating film 30.

Since the control gates 5 in FIG. 11D correspond to control gate lines CG1 to CG4 in FIG. 8, they will be denoted by reference numerals "CG1" to "CG4" instead of 5.

Through the above-described fabrication method, the semiconductor memory device according to the second embodiment of this invention will be manufactured.

Another method of fabricating the semiconductor memory device according to the second embodiment will be described below. FIGS. 12A through 12D are step-by-step perspective views illustrating the semiconductor memory device according to the second embodiment in the main steps according to the second method.

According to the fabrication method which has been explained with reference to FIGS. 11A to 11D, after the formation of the trench 11, an N-type impurity is injected in the substrate 1 with the resist film 25 as a mask on the trench 11.

This fabrication method allows the trench 11 to be formed in a single step, so that the surface of the substrate 1 will not be damaged so much. As the trench 11 should be masked by the resist film 25, lithography for this step is needed once.

The fabrication method which will be discussed below is improved to be able to fabricate a device shown in FIGS. 16 to 18 without involving the lithography.

Figure 12A:
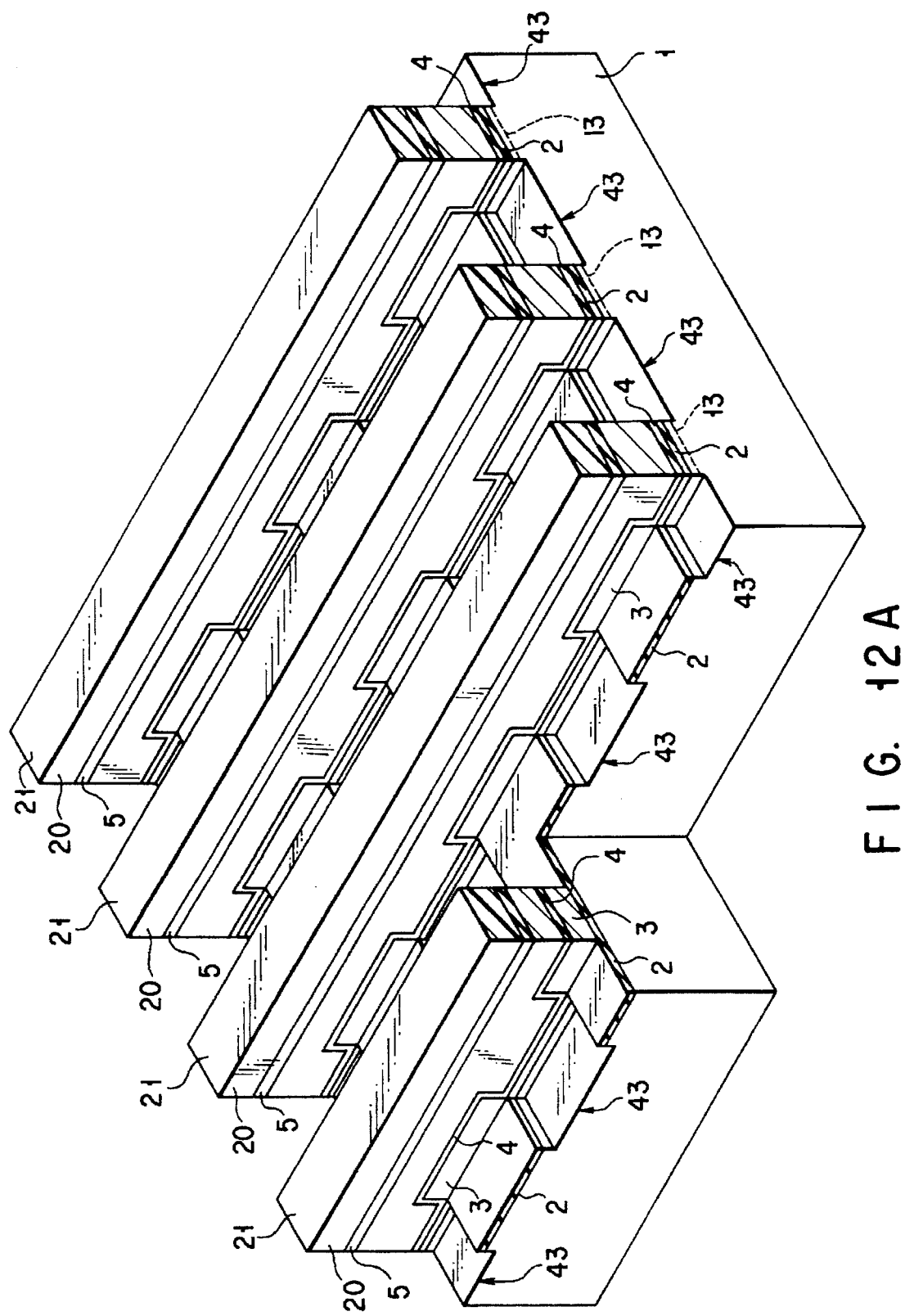
FIGS. 12A through 12D are perspective views of the semiconductor memory device according to the second embodiment of this invention in main steps of another fabrication method.

First, after the method which has been explained referring to FIGS. 6A to 6C is performed, the method which has been explained referring to FIGS. 7A and 7B is subsequently performed to provide the structure of FIG. 12A. At this time, a shallow groove 43 like the shallow groove 41 shown in FIG. 7B is formed in the region which is to be the isolation region.

Figure 12B:
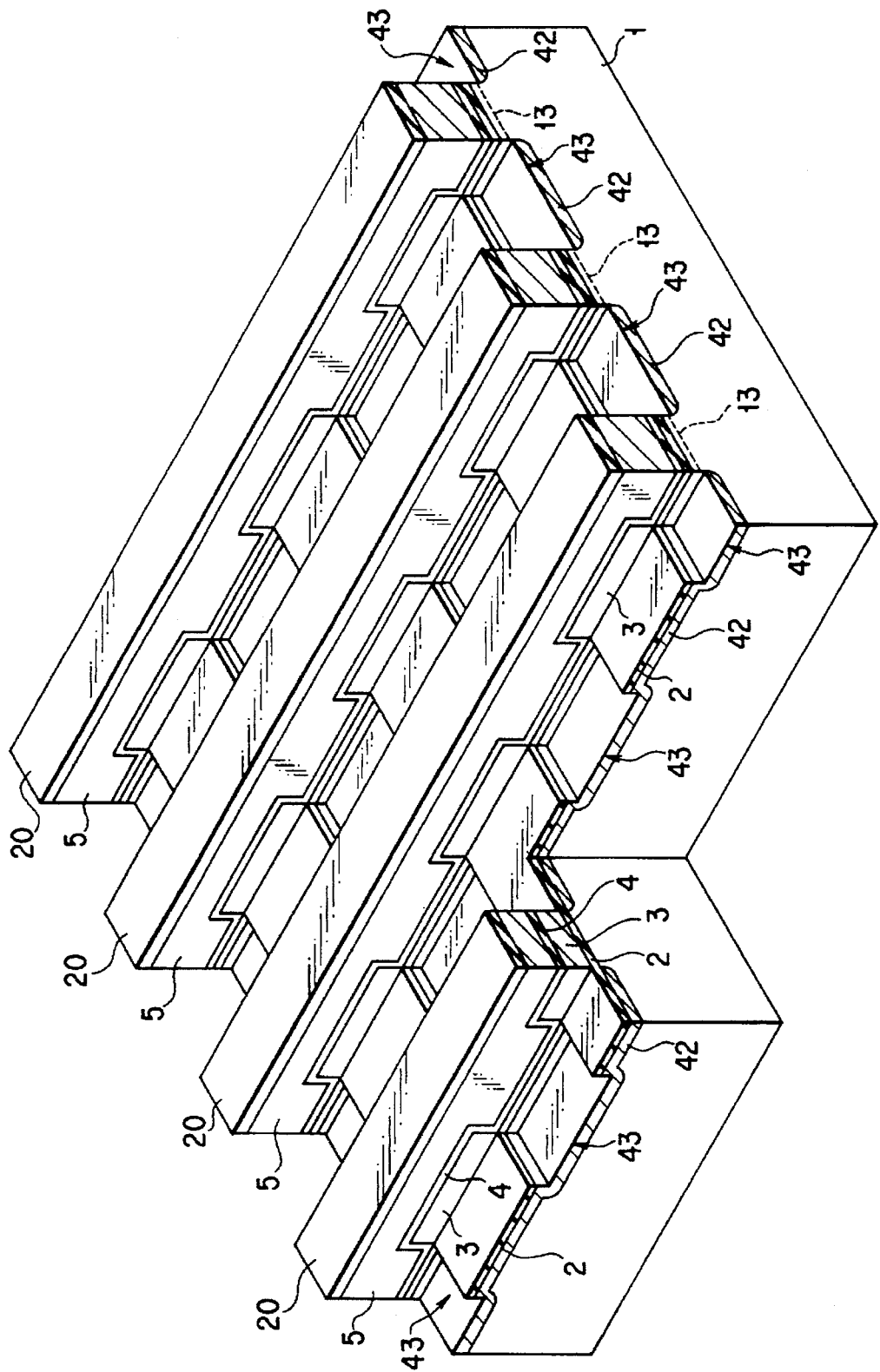

Next, after the resist film 21 is removed (the resist film 21 should not necessarily be removed), an N-type impurity (e.g., arsenic) is injected in the substrate 1, yielding a striped N-type diffusion layer 42, as shown in FIG. 12B. This step is substantially the same as the one which has been explained referring to FIG. 7C. As the source diffusion layer 7 should be formed in a stripe shape in the device according to the first embodiment, it is necessary to obtain the N-type diffusion layer 42 even at the step portion formed by the shallow groove 41. In the device according to the second embodiment, however, because the diffusion layer 51 has a land shape as shown in FIG. 8, the N-type diffusion layer 42 should not necessarily have a stripe shape.

Then, the surface of the substrate 1 exposed to the bottom of the shallow groove 43 is etched by using an etchant which ensures easy etching of silicon and makes the etching of silicon dioxide difficult, and using the first gate oxide film 2 and the dioxide film 20 as masks. At this time, as the surface of the substrate 1 is etched, the N-type diffusion layer 42 is also removed. Consequently, trench 11 having a desirable depth is formed in the region which will be the isolation region. The formation of the trench 11 separates the diffusion layer, serving as both the source and drain, as lands. Therefore, the N-type diffusion layer 42 shown in FIG. 12B is separated as lands in the region which will be the aforementioned diffusion layer, and becomes the diffusion layer 51.

Figure 12C:
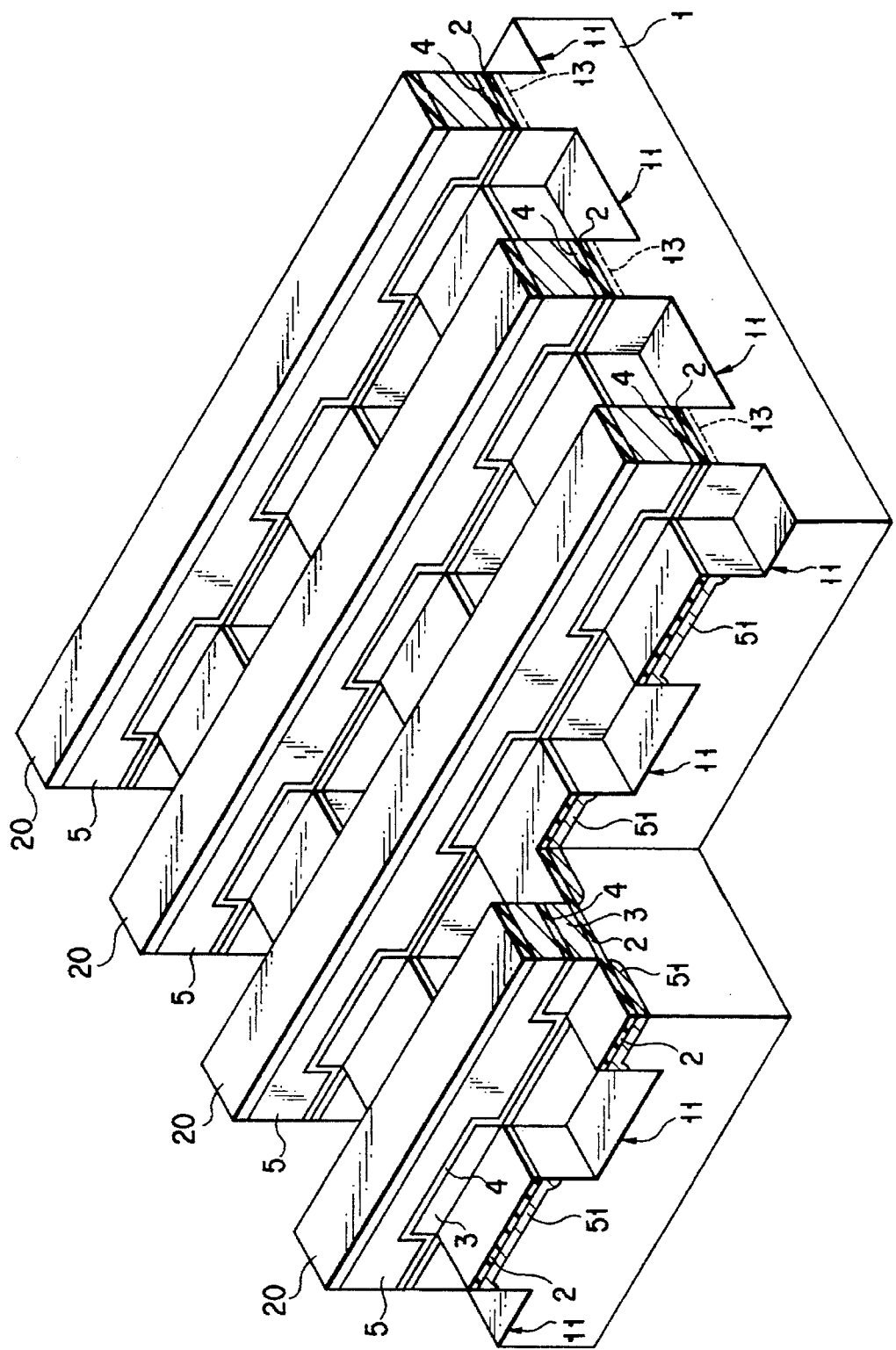
Figure 12D:
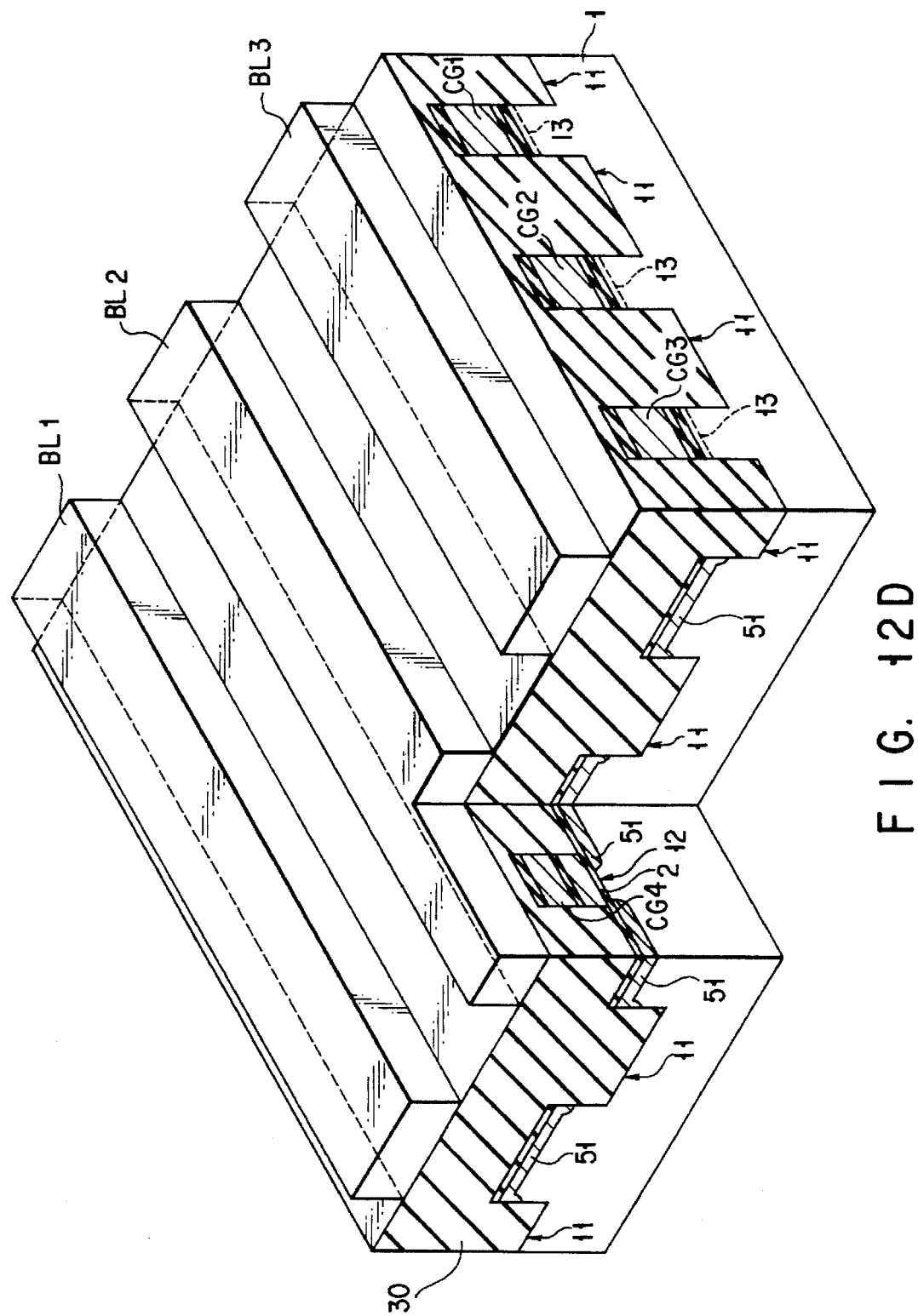

Next, as shown in FIG. 12D, silicon dioxide or the like is deposited on the structure of FIG. 12C using the CVD method, yielding an interlayer insulating film 30, and a contact hole (not shown) is formed in the selected portion of the interlayer insulating film 30 by the same fabrication method as explained with reference to FIG. 6G. Then, after the contact hole is buried with a conductor (not shown), such as tungsten, bit lines BL1 to BL3 of aluminum or the like are formed on the interlayer insulating film 30.

Since the control gates 5 in FIG. 12D, as in FIG. 11D, correspond to control gate lines CG1 to CG4 in FIG. 8, they will be denoted by reference numerals "CG1" to "CG4" instead of "5."

Through the above-described fabrication method, the semiconductor memory device according to the second embodiment of this invention will also be manufactured.

The above embodiments were described, referring to the flash-EEPROM which simultaneously erases data from two or more cell transistors. However, the present invention is not limited to this and can be applied to other types of EEPROMs. In addition, the present invention can be applied to a UV-EPROM which erases data by the irradiation of ultraviolet rays, an OTPROM (One Time Programmable ROM) which permits data to be written only once and does not permit that data from being erased, or the like.

As described above, the present invention can provide a semiconductor memory device which will improve the degree of the integration of memory cell transistors without impairing the reliability of the memory cell transistors.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
a semiconductor substrate of a first conductivity type;
a plurality of memory cell transistors arranged in a matrix on said semiconductor substrate and each including an insulated gate field effect transistor having a charge accumulation layer for variably adjusting a threshold value;
semiconductor layers of a second conductivity type formed in said semiconductor substrate and serving as current terminals of said memory cell transistors;
trenches, formed in said semiconductor substrate substantially not in contact with channel regions of said memory cell transistors, for isolating said semiconductor layers from one another; and
isolation region, other than trenches, formed in that portion of said semiconductor substrate which lies between said channel regions of said memory cell transistors.

2. A device according to claim 1, wherein said trenches isolate adjacent ones of said semiconductor layers of said memory cell transistors in a row direction of said matrix, and said isolation regions isolate adjacent ones of said channel regions of said memory cell transistors row direction.

3. A device according to claim 2, wherein said isolation regions comprise semiconductor layers of the first conductivity type having a higher impurity concentration than an impurity concentration of said semiconductor substrate.

4. A device according to claim 1, wherein said memory cell transistors are cell transistors of an erasable programmable read only memory.

5. A device according to claim 4, wherein said cell transistors of said erasable programmable read only memory are cell transistors of an electrically erasable programmable read only memory.

6. A device according to claim 5, wherein said electrically erasable programmable read only memory has a memory cell matrix having said cell transistors provided in a matrix form, and pieces of data are simultaneously erasable from at least two of said cell transistors in said memory cell matrix.

7. A device according to claim 6, wherein a system for simultaneously erasing pieces of data from said at least two of said cell transistors comprises a flash erasing system.

8. A device according to claim 7, wherein said electrically erasable programmable read only memory is a NOR type.

9. A device according to claim 7, wherein said electrically erasable and programmable read only memory is a NAND type.

10. A semiconductor memory device comprising:
a semiconductor body of a first conductivity type having a major surface, first parallel linear regions defined on said major surface, second parallel linear regions defined on said major surface, extending in a direction perpendicular to said first parallel linear regions, and planar regions defined on said major surface and surrounded by said first linear regions and said second linear regions;
trenches formed in said planar regions of said semiconductor body;
linear semiconductor regions of a second conductivity type, formed in said first parallel linear regions of said semiconductor body;
island-shaped semiconductor regions of the second conductivity type, formed in said second parallel linear regions of said semiconductor body located between said first parallel linear regions;
a plurality of gate insulating films with charge accumulation layers therein formed on portions of said first parallel linear regions of said semiconductor body between said linear semiconductor regions and said island-shaped semiconductor regions;
gate electrodes respectively provided on said gate insulating films; and
isolation regions of the first conductivity type having a higher impurity concentration than an impurity concentration of said semiconductor body formed in portions of said first parallel linear regions of said semiconductor body which are between said portions of said first linear regions on which said gate insulating films are formed.

11. A device according to claim 10, wherein said gate insulating films are gate insulators of transistors and said charge accumulation layers are electrically-floating electrodes.

12. A device according to claim 11, wherein said electrically-floating electrodes are floating gates, and said gate electrodes respectively provided on said gate insulating films are control gates.

13. A device according to claim 12, wherein said linear semiconductor regions are each a common source of at least two transistors, and said island-shaped semiconductor regions are each a common drain at least two transistors.

14. A device according to claim 13, wherein said transistors are cell transistors of an erasable programmable read only memory.

15. A device according to claim 14, wherein said cell transistors of said erasable programmable read only memory are cell transistors of an electrically erasable programmable read only memory.

16. A device according to claim 15, wherein said electrically erasable programmable read only memory is of a system for simultaneously erasing pieces of data from at least two of said cell transistors.

17. A device according to claim 16, wherein said system for simultaneously erasing pieces of data from said at least two of said cell transistors is a flash erasing system.

18. A device according to claim 17, wherein said electrically erasable programmable read only memory is a NOR type.

19. A device according to claim 17, wherein said electrically erasable and programmable read only memory is a NAND type.

20. A semiconductor device, comprising:
a semiconductor body of a first conductivity type;
a first linear structure formed on said semiconductor body, said first linear structure including at least one conductive layer;
a second linear structure formed on said semiconductor body and which is spaced from and parallel to said first linear structure, said second linear structure including at least one conductive layer;
a plurality of first isolation layers formed separately from each other in that portion of said semiconductor body which is under said first linear structure;
a plurality of second isolation layers formed separately from each other in that portion of said semiconductor body which is under said second linear structure;
a plurality of trenches formed in regions between said first and second isolation layers; and a plurality of semiconductor regions of a second conductivity type formed in said semiconductor body so as to be arranged in regions of said semiconductor body other than said portions of said semiconductor body under said first and second linear structures and other than in said plurality of trenches formed in said semiconductor body.

21. A device according to claim 20, wherein a first conductive layer of said first linear structure compress a first word line and a first conductive layer of said second linear structure compress a second word line.

22. A device according to claim 21, wherein a second conductive layer of said first linear structure compress a plurality of first charge accumulation layers and a second conductive layer of said second linear structure compress a plurality of second charge accumulation layers.

23. A semiconductor device, comprising:
a semiconductor body of a first conductivity type;
a structure formed on said semiconductor body, said structure including at least one conductive layer;
a first semiconductor region of a second conductivity type formed in a first region of said semiconductor body which is adjacent to a first side of said structure;
a second semiconductor region of the second conductivity type formed in a second region of said semiconductor body which is adjacent to a second side of said structure, said second side of said structure being opposite to said first side of said structure;
trenches formed in regions of said semiconductor body other than regions which are adjacent to sides of said structure other than said first and second sides; and
isolation regions, other than trenches, formed in third and fourth regions of said semiconductor body which are adjacent to third and fourth sides of said structure.

24. A semiconductor device, comprising:
a semiconductor body of a first conductivity type having a mesh-like protrusion including first mesh portions extending in a first direction with a predetermined spacing therebetween, said mesh-like protrusion being defined by a plurality of trenches formed in said semiconductor body;
structures, each including at least one conductive layer, formed on respective ones of said first mesh portions of said mesh-like protrusion;
a plurality of semiconductor regions of a second conductivity type formed on portions of said semiconductor body other than said first mesh portions of said mesh-like protrusion; and
isolation regions, other than trenches, which are formed in portions of said semiconductor body under said structures and adjacent to sides of said trenches.

25. A device according to claim 24, wherein a first conductive layer of each of said structures comprises word line.

26. A device according to claim 25, wherein a second conductive layer of each of said structures comprises a plurality of charge accumulating layers.

27. A semiconductor device, comprising:
a semiconductor body of a first conductivity type;
a plurality of trenches, arranged in a row and column matrix, formed in said semiconductor body;
first and second spaced apart semiconductor regions of a second conductivity type formed in regions of said semiconductor body between said trenches;
a structure including at least one conductive layer formed on the space between said first and second semiconductor regions; and isolation regions, other than trenches, formed in regions of said semiconductor body which are adjacent to sides of said space between said first and second semiconductor regions.

28. A semiconductor device, comprising:
a semiconductor body of a first conductivity type having a mesh-like protrusion including first mesh portions extending in a first direction with a first predetermined spacing therebetween and second mesh portions extending in a second direction with a second predetermined spacing therebetween, said mesh-like protrusion being defined by a plurality of trenches formed in said semiconductor body;
structures, each including at least one conductive layer, respectively formed on said first mesh portions of said mesh-like protrusion of said semiconductor body;
a plurality of semiconductor regions of a second conductivity type formed on said second mesh portions of said mesh-like protrusion of said semiconductor body; and
isolation regions, other than trenches, formed in portions of said semiconductor body under said structures and adjacent to sides of said trenches.

29. A device according to claim 28, wherein a first conductive layer of said structures are word lines.

30. A device according to claim 29, wherein a second conductive layer of said structures are charge accumulation layers.

31. A device according to claim 29, wherein said semiconductor regions are current terminals of memory cell transistors.

32. A semiconductor device, comprising:
a semiconductor body of a first conductivity type comprising a cross-shaped protrusion;
a transistor having a channel region at the crossing point of said cross-shaped protrusion;
first and second semiconductor regions of a second conductivity type, said first and second semiconductor regions constituting source and drain regions of said transistor and being formed in a first region of said cross-shaped protrusion such that said channel region is arranged between said first and second semiconductor regions; and
first and second isolation regions for isolating said channel region, said first and second isolation regions formed in a region of said cross-shaped protrusion other than said first region such that said channel region is arranged between said first and second isolation regions.

33. A device according to claim 32, wherein said first and second isolation regions are diffusion regions of the first conductivity type.

34. A semiconductor device, comprising:
a semiconductor body of a first conductivity type;
a first column of trenches formed in said semiconductor body, said first column of trenches including first and second trenches arranged adjacent to each other;
a second column of trenches, which is adjacent to said first column of trenches, formed in said semiconductor body, said second column of trenches including third and fourth trenches arranged adjacent to each other;
a first semiconductor region of a second conductivity type formed in a region of said semiconductor body between said first and third trenches;
a second semiconductor region of the second conductivity type formed in a region of said semiconductor body between said second and fourth trenches;

a first isolation region formed in a region of said semiconductor body between said first and second trenches;

a second isolation region formed in a region of said semiconductor body between said third and fourth trenches; and a transistor in which said first and second semiconductor regions constitute source and drain regions, said transistor having a channel region in a region of said semiconductor body between said first and second semiconductor regions and between said first and second isolation regions.

35. A semiconductor device, comprising:

a semiconductor body of a first conductivity type;

a plurality of device sections arranged in a matrix on a region of said semiconductor body, each device section having four rows and two columns which define a first section part at a crossing of a first row and a first column, a second section part at a crossing of a second row and said first column, a third section part at a crossing of a third row and said first column, a fourth section part at a crossing of a fourth row and said first column, a fifth section part at a crossing of said first row and a second column, a sixth section part at a crossing of said second row and said second column, a seventh section part at a crossing of said third row and said second column, and an eighth section part at a crossing of said fourth row and said second column;

first structures, each including at least one conductive layer and an isolation region of the first conductivity type formed in said semiconductor body, formed in said first section parts of said device sections;

first semiconductor regions of a second conductivity type formed in said second section parts of said device sections;

second structures, each including at least one conductive layer and an isolation region of the first conductivity type formed in said semiconductor body, formed in said third section parts of said device sections;

trenches formed in said fourth section parts of said device sections;

third structures, each including at least one conductive layer, formed in said fifth section parts of said device sections;

second semiconductor regions of the second conductivity type formed in said sixth section parts of said device sections;

fourth structures, each including at least one conductive layer, formed in said seventh section parts of said device sections; and third semiconductor regions of the second conductivity type formed in said eighth section parts of said device sections.

36. A semiconductor device, comprising:

a semiconductor body of a first conductivity type;

a plurality of device sections arranged in a matrix on a region of said semiconductor body, each device section having two rows and two columns which define a first section part at a crossing of a first row and a first column, a second section part at a crossing of a second row and said first column, a third section part at a crossing of said first row and a second column, and a fourth section part at a crossing of second row and said second column;

first structures, each including at least one conductive layer and an isolation region of the first conductivity type formed in said semiconductor body, formed in said first section parts of said device sections;

trenches formed in said second section parts of said device sections;

second structures, each including at least one conductive layer, formed in said third section parts of said device sections; and semiconductor regions of a second conductivity type formed in said fourth section parts of said device sections.

37. A semiconductor memory device, comprising:

a semiconductor substrate;

memory cells arranged in a row and column matrix on said semiconductor substrate, each of said memory cells including a transistor having first and second current terminal regions spaced apart from each other in a column direction by a channel region;

word lines connected to said memory cells and extending in a row direction;

bit lines connected to said memory cells and extending in the column direction;

first isolating regions, formed in portions of said semiconductor substrate between the first current terminals of adjacent memory cells in the rows of said matrix, for isolating the first current terminals of the memory cells in the rows of said matrix from each other, wherein substantially no part of said isolating regions is formed in portions of said semiconductor substrate between the channel regions of adjacent memory cells in the rows of said matrix, said first isolating regions comprising trenches; and second isolating regions, formed in said portions of said semiconductor substrate between the channel regions of adjacent memory cells in the rows of said matrix, for isolating the channel regions of the memory cells in the rows of said matrix from each other, said second isolating regions comprising diffusion layers.

38. A semiconductor memory device according to claim 37, wherein said diffusion layers and said semiconductor substrate are of the same conductivity type and said diffusion layers have a higher impurity concentration than said semiconductor substrate.

39. A semiconductor memory device according to claim 37, wherein the transistor of each of said memory cells includes a charge accumulation layer.

40. A semiconductor memory device according to claim 37, wherein said memory cells are erasable programmable read only (EPROM) memory cells.

41. A semiconductor memory device according to claim 37, wherein said memory cells are electrically erasable programmable read only memory (EEPROM) cells.

42. A semiconductor memory device according to claim 37, wherein said memory cells are arranged in a NOR configuration.

43. A semiconductor memory device according to claim 37, wherein said memory cells are arranged in a NAND configuration.

44. A semiconductor device, comprising:

a semiconductor body;

a linear first current terminal region formed in said semiconductor body;

second current terminal regions formed in said semiconductor body and spaced apart from each other in a direction which is parallel to said linear first current terminal region, whereby spaced apart channel regions are formed between said linear first current terminal region and said spaced apart second current terminal regions;

isolating regions of a first type formed in the spaces between said spaced apart second current terminal regions; and isolating regions of a second type different than the first type formed in the spaces between said channel regions.

45. A semiconductor device according to claim 44, wherein said isolating regions of the first type comprise trenches.

46. A semiconductor device according to claim 44, wherein said isolating regions of the second type comprise impurity regions formed in said semiconductor body.

47. A semiconductor device according to claim 44, further comprising a word line formed above said channel regions.

48. A semiconductor device according to claim 44, further comprising charge accumulation layers formed above said channel regions.

49. A semiconductor device, comprising:

a semiconductor body;

spaced apart first current terminal regions formed in said semiconductor body;

second current terminal regions formed in said semiconductor body and spaced apart from each other in a direction which is parallel to a direction in which said first current terminal regions are spaced apart from each other, whereby spaced apart channel regions are formed between said first and second current terminal regions;

isolating regions of a first type formed in the spaces between said spaced apart first current terminal regions and in the spaces between said second spaced apart current terminal regions; and isolating regions of a second type different than the first type formed in the spaces between said channel regions.

50. A semiconductor device according to claim 49, wherein said isolating regions of the first type comprise trenches.

51. A semiconductor device according to claim 49, wherein said isolating regions of the second type comprise impurity regions formed in said semiconductor body.

52. A semiconductor device according to claim 49, further comprising a word line formed above said channel regions.

53. A semiconductor device according to claim 52, further comprising charge accumulation layers formed above said channel regions.

* * * * *